United States Patent [19]

Kim

[11] Patent Number: 5,741,719
[45] Date of Patent: Apr. 21, 1998

[54] NONVOLATILE MEMORY DEVICE AND METHOD OF MANUFACTURING THE SAME

[75] Inventor: Keon-soo Kim, Kyungki-do, Rep. of Korea

[73] Assignee: Samsung Electronics Co., Ltd., Suwon, Rep. of Korea

[21] Appl. No.: 789,533

[22] Filed: Jan. 27, 1997

Related U.S. Application Data

[62] Division of Ser. No. 615,064, Mar. 13, 1996.

[30] Foreign Application Priority Data

Mar. 13, 1995 [KR] Rep. of Korea ............ 95-5146

[51] Int. Cl.⁶ .................................................. H01L 21/8247
[52] U.S. Cl. ............................... 437/43; 437/52; 437/195
[58] Field of Search .......................... 437/43, 48, 52, 437/195

[56] References Cited

U.S. PATENT DOCUMENTS

| | | | |
|---|---|---|---|
| 5,282,160 | 1/1994 | Yamagata | 365/185 |
| 5,519,239 | 5/1996 | Chu | 257/314 |
| 5,589,412 | 12/1996 | Iranmanesh et al. | 437/43 |
| 5,589,413 | 12/1996 | Sung et al. | 437/43 |
| 5,631,179 | 5/1997 | Sung et al. | 438/264 |

*Primary Examiner*—John Niebling
*Assistant Examiner*—Richard A. Booth
*Attorney, Agent, or Firm*—Cushman Darby & Cushman IP Group of Pillsbury Madison & Sutro LLP

[57] ABSTRACT

In a nonvolatile memory device and manufacturing method, the device includes cell transistors having sources and drains shared by cell transistors adjacent in a first direction, a floating gate confined to the respective cell transistors, and a control gate shared by cell transistors adjacent in a second direction, first plugged conductive layers formed in a long rod shape in the second direction so that sources of cell transistors adjacent in the second direction are connected with one another, second plugged conductive layers each connected with drains of the respective cell transistors, a common source line formed in a long rod shape in the second direction so as to be connected with the first plugged conductive layers thereon, a pad layer formed so as to be confined to the respective cell transistors on the second plugged conductive layers, and a bit line connected with the pad layer through a contact hole.

11 Claims, 20 Drawing Sheets

5,741,719

NONVOLATILE MEMORY DEVICE AND METHOD OF MANUFACTURING THE SAME

This is a division of application Ser. No. 08/615,064, filed Mar. 13, 1996.

BACKGROUND OF THE INVENTION

The present invention relates to a nonvolatile memory device and a method of manufacturing the same, and more particularly, to a nonvolatile memory device and manufacturing method which allows for increased integration.

In a nonvolatile memory such as a flash memory, in general, a transistor having a source/drain and a gate electrode, including a floating gate and a control gate, constitutes a memory cell transistor. Here, the floating gate stores data and the control gate controls the floating gate.

The flash memory is described in detail in "A 2.3 µm$^2$ memory cell structure for 16 Mb NAND EEPROMs" IEDM 1990, pp. 103–106 by R. Shirota.

The operation of a cell transistor includes an erase operation, for drawing electrons out from the floating gate to the source, drain and bulk (channel) to lower the threshold voltage of the cell, a program operation, for implanting channel hot electrons to the floating gate using gate and drain potentials higher than the source potential to increase the threshold voltage of the cell, and a read operation, for reading an erase or program state of the cell.

FIG. 1 is a cross-sectional view showing a conventional nonvolatile memory device.

As shown in FIG. 1, a unit cell transistor for a nonvolatile memory includes source 11 and drain 12, both formed in semiconductor substrate 1, a gate electrode formed, on semiconductor substrate 1 between source 11 and drain 12, to include a floating gate 5 and a control gate 9, a common source line 15 formed on source 11, pad layer 16 formed on drain 12 and bit line 21 connected to pad layer 16, via filled tungsten 19.

At this time, source 11 and drain 12 are shared by adjacent cell transistors along a first direction. Floating gate 5 is confined to the respective cell transistors. Control gate 9 is shared with adjacent cell transistors along a second direction. Common source line 15 is shared with sources of the adjacent cell transistors along the second direction. Pad layer 16 is confined to the cell transistors. Bit line 21 is shared with drains of adjacent cell transistors along the first direction. Common source line 15 and pad layer 16 are formed by a self-align contact (SAC) technique. Contact hole 23 connecting bit line 21 and drain 12 is filled with tungsten 19.

In the conventional nonvolatile memory device, common source line 15 and pad layer 16 are formed using the SAC technique, thereby improving the integration of the memory cell.

However, since common source line 15 and pad layer 16 are formed by the same photolithograpy process, the distance therebetween is limited by their design rule. In other words, to increase the integration of the memory device, the distance between the unit cell transistors and the distance between various elements should be reduced as much as possible. However, there is a limit in reducing the distances between common source line 15 and pad layer 16 formed by the same photolithograpy process.

Secondly, in forming contact hole 23 on pad layer 16 for connecting bit line 21 with drain 12, contact hole 23 may not be opened completely since the contact hole to be formed is deep (see FIG. 1). If so, a contact failure results, leading to malfunction of the memory device.

Thirdly, to fill contact hole 23 with tungsten, tungsten should be fully deposited to the brim. As a result, scattered particles may be generated, which obstructs a good yield. Also, because of the physical stress applied to the cell transistors by filling the contact holes with tungsten 19, cell transistor characteristics may be degraded.

SUMMARY OF THE INVENTION

It is an object of the present invention to provide a nonvolatile memory device to solve the above problems.

It is another object of the present invention to provide the most suitable method of manufacturing the nonvolatile memory device.

To accomplish the first object, there is provided a nonvolatile memory device according to the present invention comprising: cell transistors having sources and drains shared by cell transistors adjacent in a first direction, a floating gate confined to the respective cell transistors, and a control gate shared by cell transistors adjacent in a second direction; first plugged conductive layers formed in a long rod shape in the second direction so that the sources of cell transistors adjacent in the second direction are connected with one another; second plugged conductive layers each connected with the drains of the respective cell transistors; a common source line formed in a long rod shape in the second direction so as to be connected with the first plugged conductive layers thereon; a pad layer formed so as to be confined to the respective cell transistors on the second plugged conductive layers; and a bit line connected with the pad layer through a contact hole.

In the nonvolatile memory device according to the present invention, it is preferable that the first and second plugged conductive layers are formed of impurity-doped polysilicon and the common source line and the pad layer are formed of silicide. At this time, the silicide is tungsten silicide.

In the nonvolatile memory device according to the present invention, it is preferable that the drains are formed of a first high concentration impurity layer of a second conductivity type and a low concentration impurity layer of a first conductivity type surrounding the first high concentration impurity layer of the second conductivity type. Also, it is preferable that the sources are formed of a low concentration impurity layer of the second conductivity type and a second high concentration impurity layer of the second conductivity type, partially overlapped with the low concentration impurity layer of the second conductivity type.

To accomplish the second object, there is provided a method of manufacturing a nonvolatile memory device according to an embodiment of the present invention, comprising the steps of: forming cell transistors having sources and drains shared by cell transistors adjacent to one another in a first direction, a floating gate confined to each of the cell transistors, and a control gate shared by cell transistors adjacent in a second direction; forming a first conductive layer so as to fill grooves between the respective cell transistors, on the resultant structure of the cell transistor forming step; plugging only the grooves with the first conductive layer by etching back the same; forming a second conductive layer on the resultant structure of the plugging step; forming a first insulating layer on the second conductive layer; forming a first insulating layer pattern in a rod shape lengthwise in a second direction by patterning the insulating layer so as to contain the sources of cell transistors adjacent in the second direction; forming a first photosensitive pattern in a shape separated from that of adjacent cell transistors on the drains of the respective cell transistors; and forming a first plugged conductive layer formed of the first conductive layer for connecting the sources of the cell transistors adjacent in the second direction, a common source line formed of the second conductive layer, being in parallel with the first plugged conductive layer, a second plugged conductive layer formed of the first conductive layer for connecting the drains of the respective cell transistors, and a pad layer formed of the second conductive layer for being connected with the second plugged conductive layer, by etching the first and second conductive layers using the first insulating layer pattern and first photosensitive pattern as an etching mask.

In a method of a nonvolatile memory device according to the present invention, it is preferable to further comprise the steps of: forming an interlayer insulating film, forming a contact hole in the interlayer insulating film to expose the pad layer and forming a bit line for connecting the pad layer through the contact hole, after the pad layer forming step.

In a method of a nonvolatile memory device according to the present invention, it is preferable that impurity-doped polysilicon is used as the first conductive layer and silicide material is used as the second conductive layer. At this time, tungsten silicide is used as the silicide material.

In the method of a nonvolatile memory device according to the present invention, the cell transistor forming step preferably includes the substeps of: forming a field oxide layer for dividing a semiconductor substrate into an active region and a field region; forming a gate insulating layer on the active region of the semiconductor substrate; forming a third conductive layer on the resultant structure including the gate insulating layer; forming a floating gate pattern of a rod shape lengthwise in a first direction by patterning the third conductive layer; sequentially depositing a dielectric film, a fourth conductive layer and a fifth conductive layer over the entire surface of the resultant structure having the floating gate pattern; forming a floating gate confined to the respective cell transistors and a control gate shared by cell transistors which are adjacent in the second direction by patterning the floating gate pattern, dielectric film, fourth conductive layer and fifth conductive layer in a rod shape lengthwise in a second direction; forming a second photoresist layer pattern exposing a region of the semiconductor substrate where drains are to be formed; forming drains having a first high-concentration impurity layer of a second conductivity type and a low-concentration impurity layer of a first conductivity type surrounding the first high-concentration impurity layer of the second conductivity type, the drains shared by cell transistors which are adjacent in the first direction by implanting low-concentration impurities of the first conductivity type and then implanting the first high-concentration impurities of the second conductivity type; removing the second photosensitive pattern; implanting low-concentration impurities of the second conductivity type over the semiconductor substrate from which the second photosensitive pattern has been removed; forming spacers on the side wall of the gate electrodes of the respective cell transistors by forming a second insulating layer over the resultant structure having low-concentration impurities injected thereto and then anisotropically etching the same; and forming sources having a second high-concentration impurity layer of the second conductivity type and a low-concentration impurity layer of the second conductivity type, partially overlapped the second high-concentration impurity layer of the second conductivity type by implanting the second high-concentration impurities of the second conductivity type over the semiconductor substrate having the spacers, the sources being shared by cell transistors which are adjacent in the first direction.

It is preferable that impurity-doped polysilicon is used as the third and fourth conductive layers and tungsten silicide is used as the fifth conductive layer.

Also, it is preferable that the impurities of the first conductivity type is P-impurities and the impurities of the second conductivity type is N-impurities.

At this time, in the drain forming step, the step of implanting low concentration impurities of the first conductivity type is performed so that boron ions are implanted at a dose of 1.0 E13 to 1.0 E14 ions/cm$^2$ with an energy of about 50 to 150 KeV, and the step of implanting the second high concentration impurities of the second conductivity type is performed so that arsenic ions are implanted at a dose of 1.0 E15 to 6.0 E15 ions/cm$^2$ with an energy of about 30 to 80 KeV.

In the source forming step, the step of implanting the second conductivity type low concentration impurities is performed so that phosphorus ions are implanted at a dose of 1.0 E13 to 5.0 E13 ions/cm$^2$ with an energy of about 30 to 80 KeV, and the step of implanting the second conductivity type high concentration impurities is performed so that arsenic ions are implanted at a dose of 6.0 E15 ions/cm$^2$ with an energy of about 30 to 100 KeV.

In the method of a nonvolatile memory device according to the present invention, the step of patterning the floating gate pattern, dielectric film, fourth and fifth conductive layers is processed by the substeps of: forming a third insulating layer on the fifth conductive layer; forming a third photosensitive pattern for forming a control gate in a long rod shape lengthwise in a second direction by depositing a photoresist on the third insulating layer and performing a photolithography process with respect thereto; forming a third insulating layer pattern for forming a control gate by anisotropically etching the third insulating layer using the third photosensitive pattern as an etching mask; and anisotropically etching the fifth conductive layer, fourth conductive layer, dielectric layer and floating gate pattern using the third insulating pattern as an etching mask.

To accomplish another object of the present invention, there is provided a method of manufacturing a nonvolatile memory device according to another embodiment of the present invention, the method comprising the steps of: forming cell transistors having sources and drains shared by cell transistors adjacent in a first direction, a floating gate confined to the respective cell transistors, and a control gate shared by cell transistors adjacent in a second direction; forming a first conductive layer to fill grooves between the respective cell transistors on the resultant structure obtained by the cell transistor forming step; plugging only the grooves with the first conductive layer by etching back the first conductive layer; forming a second conductive layer on the resultant structure obtained by the plugging step; forming a first insulation layer on the second conductive layer; forming a first insulation layer pattern on the drains of the respective cell transistors to be confined to the respective cell transistors by etching the first insulation layer; coating a photoresist on the resultant structure having the first insulation layer formed; forming a first photosensitive pattern in a long rod shape in a second direction to include sources which are adjacent in the second direction; and forming a first plugged conductive layer formed of the first conductive layer for connecting the sources of the cell transistors adjacent in the second direction, a common source line formed of the second conductive layer, being in parallel with the first plugged conductive layer, a second plugged conductive layer formed of the first conductive layer for connecting the drains of the respective cell transistors, and a pad layer formed of the second conductive layer for being connected with the second plugged conductive layer, by etching the first and second conductive layers using the first insulation layer pattern and first photosensitive pattern as an etching mask.

Therefore, according to the nonvolatile memory device and manufacturing method of the present invention, improved integration is easily attained, contact failure can be prevented and problems due to buried tungsten can be prevented.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
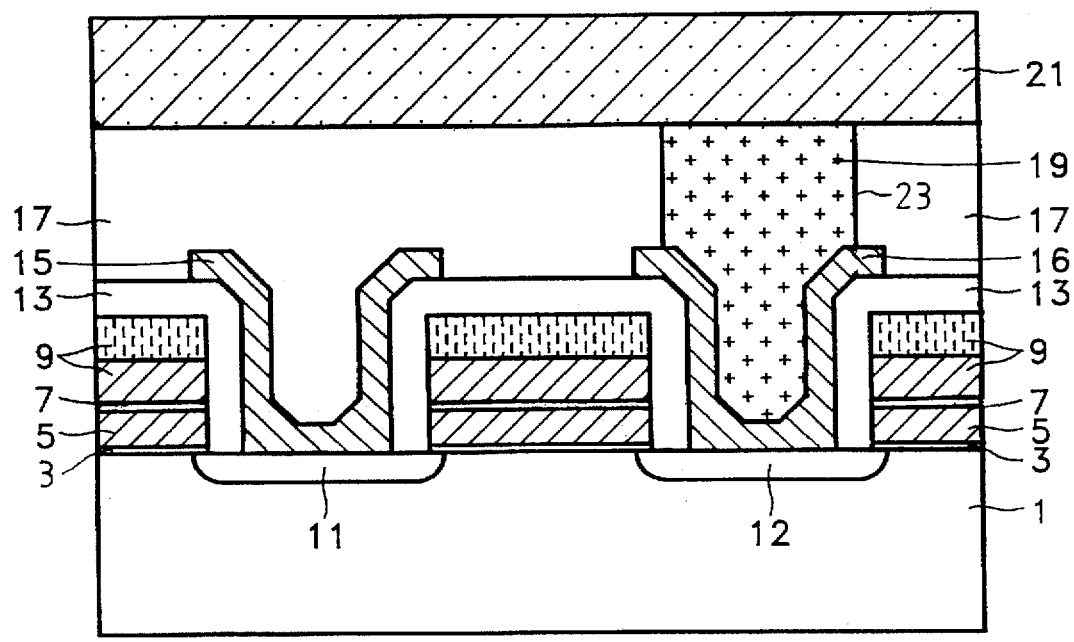
FIG. 1 is a cross-sectional view showing a nonvolatile memory device manufactured by a conventional method.
Figure 2:
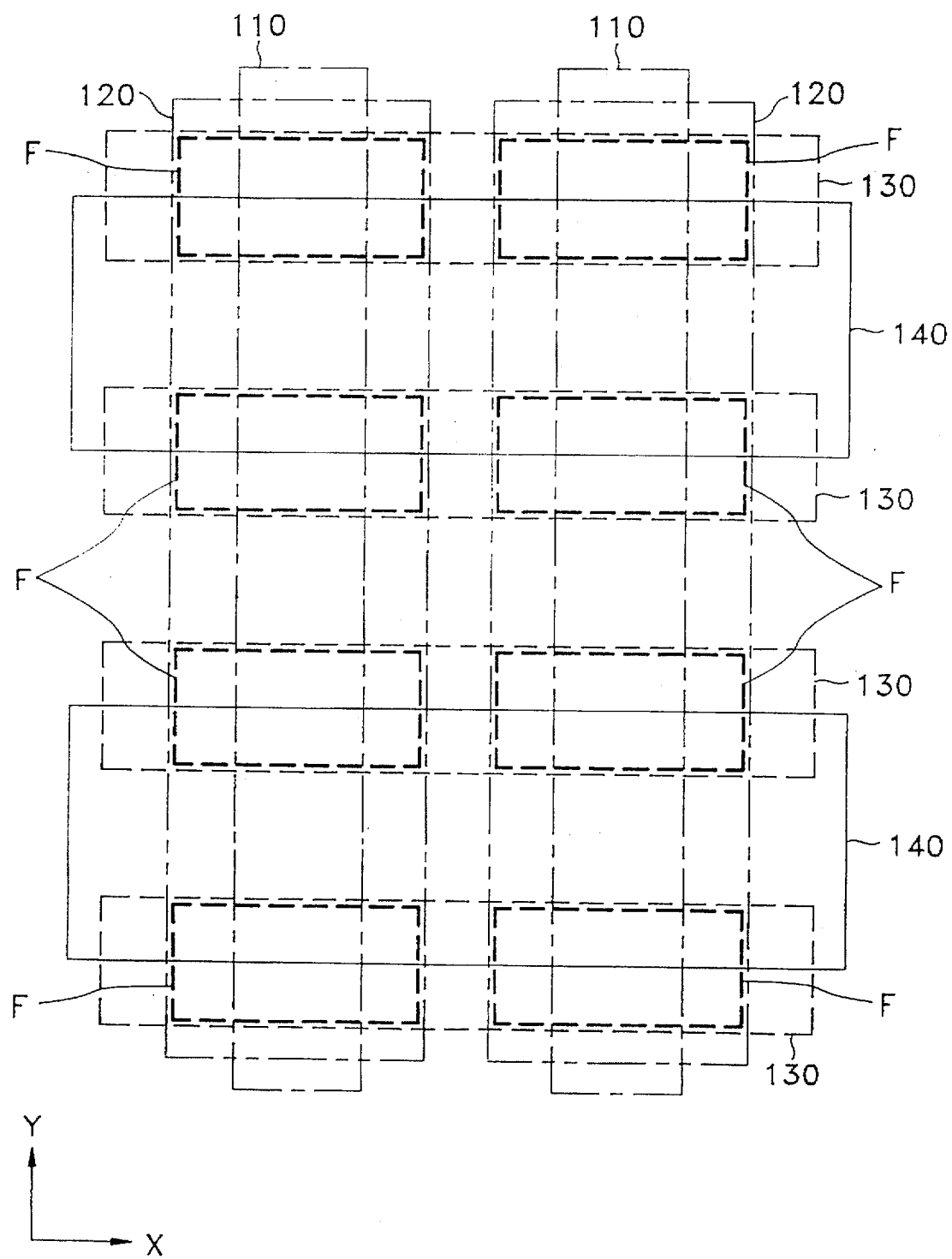
FIGS. 2 through 5 are layout diagrams used in manufacturing a nonvolatile memory device according to first and second embodiment of the present invention.

In FIG. 2, mask pattern 110, for forming a field oxide which defines an active region and a field region on a semiconductor substrate, is represented by a rectangle extending lengthwise along the Y axis as indicated by a single-dashed line, mask pattern 120, for forming a floating gate pattern, is represented by a rectangle extending lengthwise along the Y axis is indicated by a double-dashed line, mask pattern 130, for forming a control gate is represented by a rectangle extending lengthwise along the X axis as indicated by a dotted line, and mask pattern 140, for forming a drain, is represented by a rectangle extending lengthwise along the X axis as indicated by a solid line. Also, in FIG. 2, a rectangle (F), defined by a thick dotted line in a matrix shape, represents a floating gate.

Figure 3:
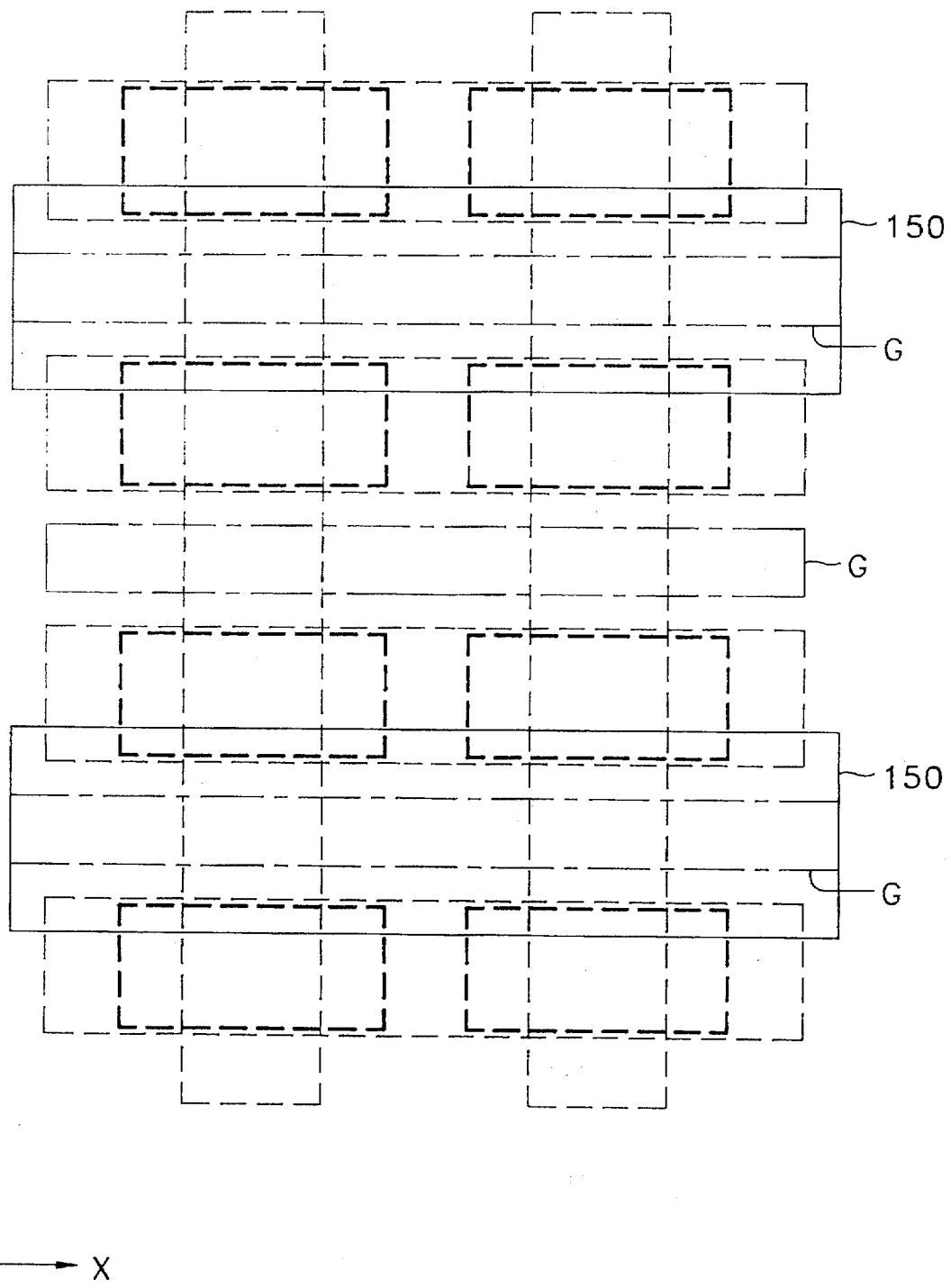

In FIG. 3, rectangle (G) extending lengthwise along the X axis as indicated by a single-dashed line represents a plugged conductive layer, and a rectangle extending lengthwise along the X axis as indicated by a solid line represents mask pattern 150 for forming a pad layer.

Figure 4:
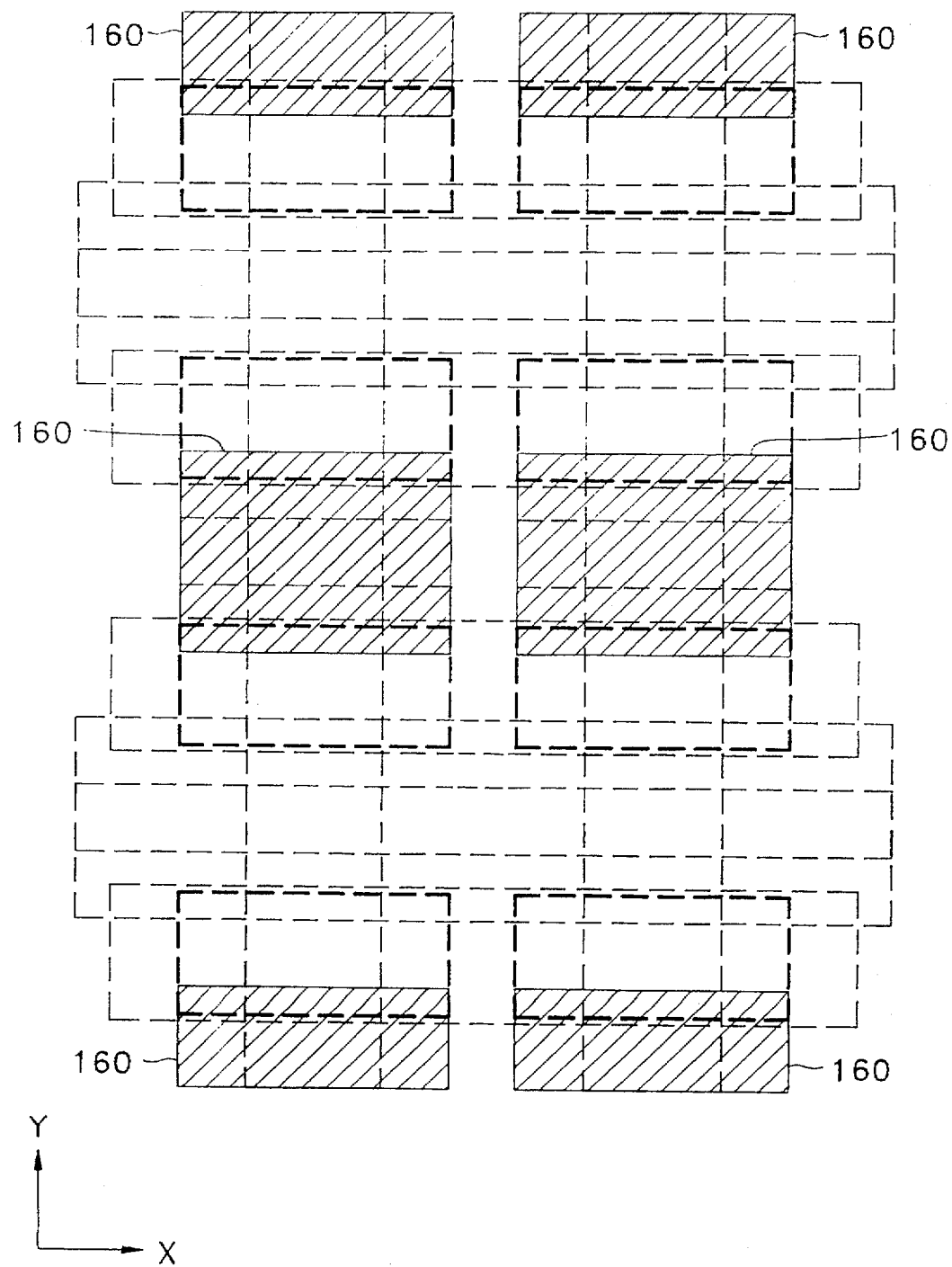

In FIG. 4, cross-hatched rectangle bounded by solid line represents a mask pattern 160, for forming a pad layer.

Figure 5:
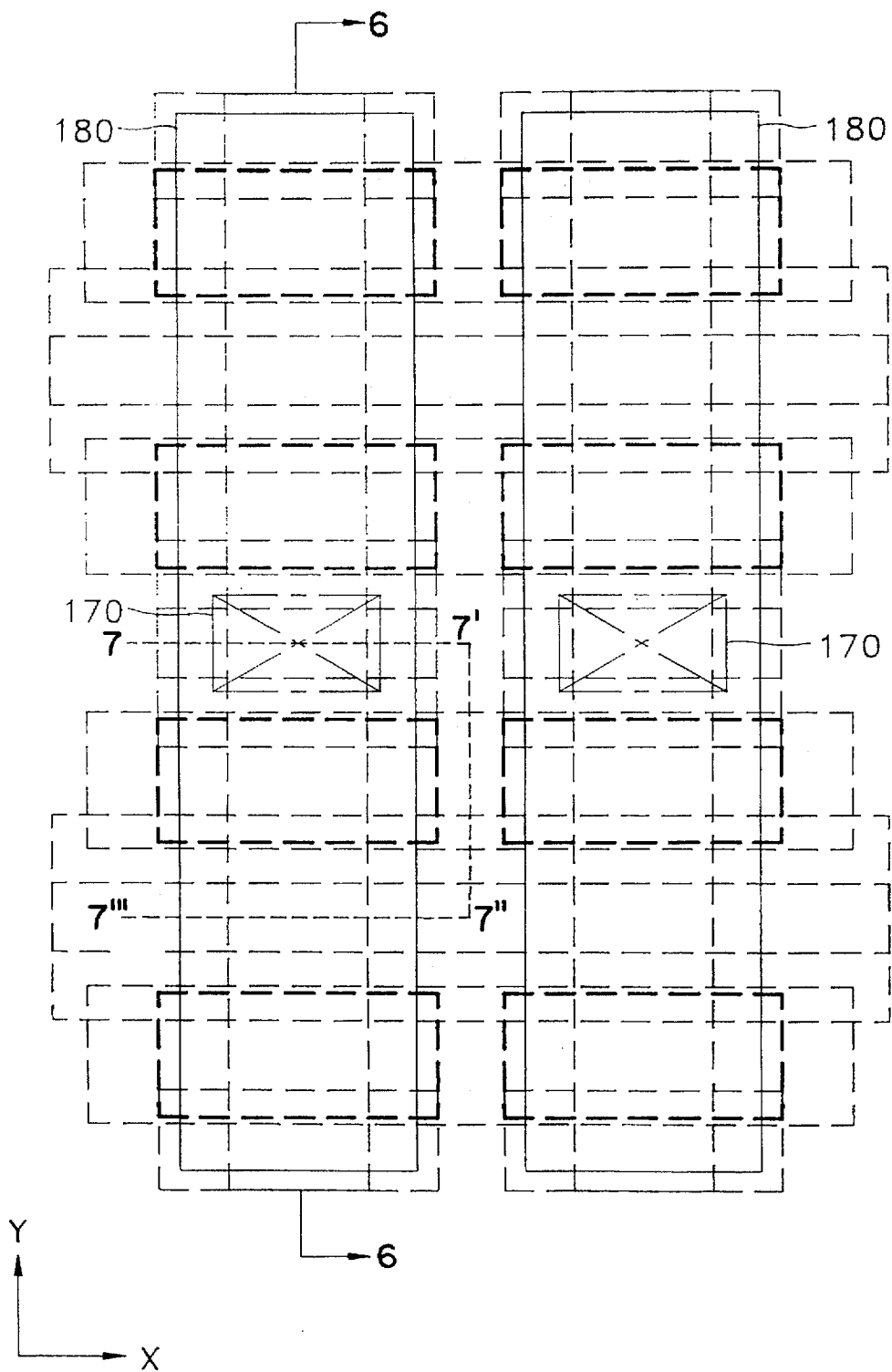

In FIG. 5, a rectangle having internal diagonal lines and indicated by a single-dashed line represents mask pattern 170, for forming a contact hole, and a rectangle extending lengthwise along the Y axis as indicated by a solid line represents mask pattern 180, for forming a bit line.

Figure 6:
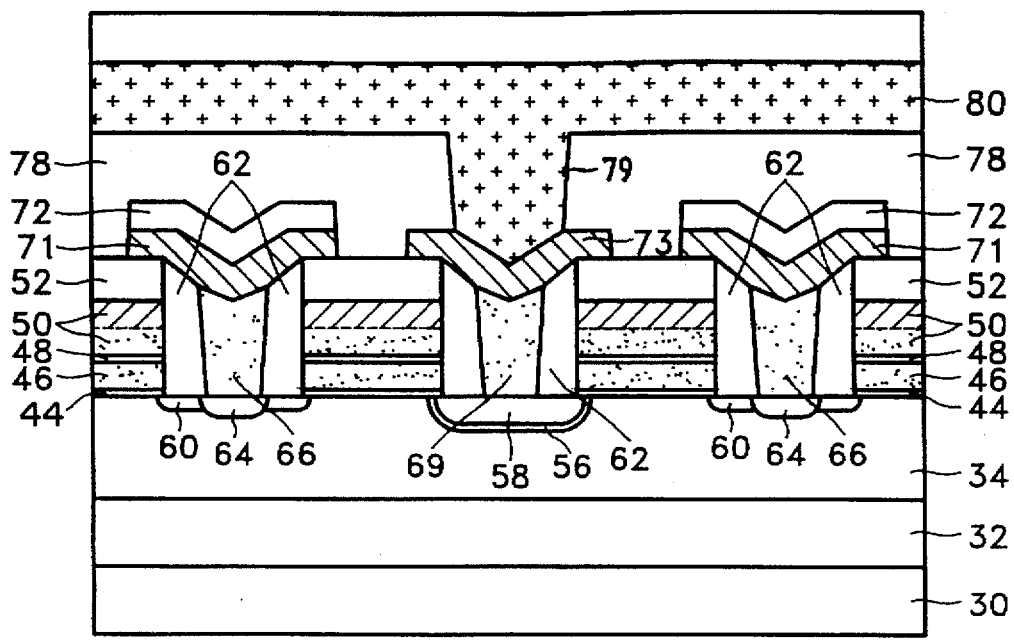
FIGS. 6 and 7 are cross-sectional views of a nonvolatile memory device according to the first embodiment of the present invention taken along lines 6–6' and 7–7'–7", respectively, of FIG. 5.
Figure 7:
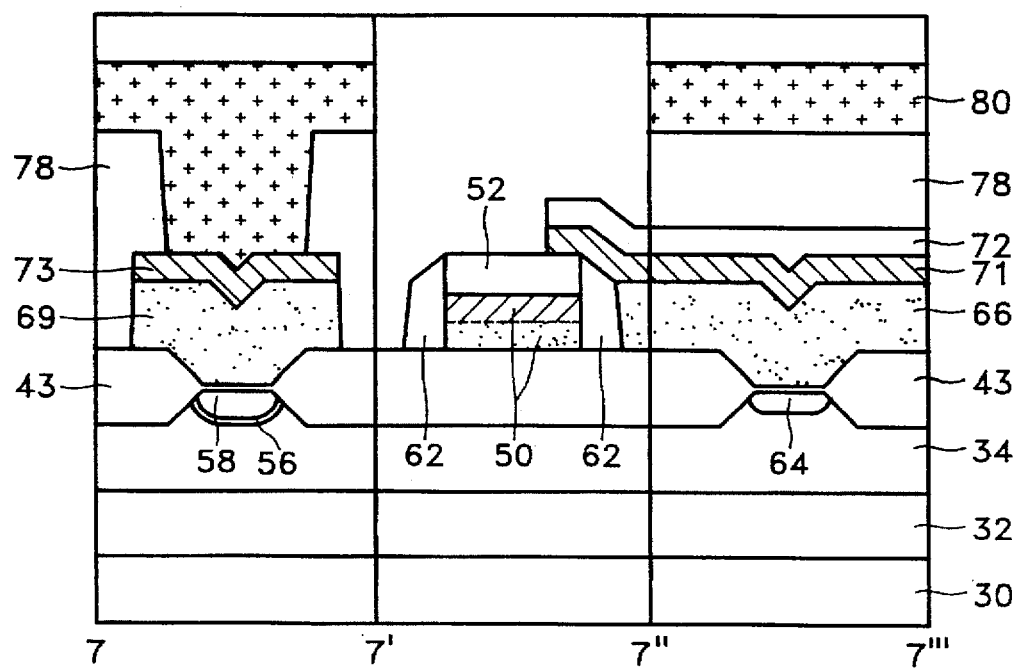

FIGS. 6 and 7 are cross-sectional views of a nonvolatile memory device according to a first embodiment of the present invention, in which FIG. 6 is taken along line 6–6' of FIG. 5, and FIG. 7 is taken along line 7–7'–7"–7'" of FIG. 5.

The gate electrode is composed of floating gate 46 confined to the respective cell transistors and control gate 50 shared adjacent cell transistors along the direction of the X axis. The drain is composed of P-type low concentration impurity layer 56 and N-type first high concentration impurity layer 58. The source is composed of N-type low concentration impurity layer 60 and an N-type second high concentration impurity layer 64. At this time, source 400 and drain 300 are shared by the adjacent cell transistors along the direction of the Y axis.

First plugged conductive layer 66 is formed in a rod shape extending lengthwise along the direction of the X axis so as to be shared by source 400 of the adjacent cell transistors along the direction of the X axis. Second plugged conductive layer 69 is formed in each of the respective cell transistors so as to be connected with drain 300 of the respective cell transistors.

Also, common source line 71 is formed on first plugged conductive layer 66 so as to be shared by the adjacent cell transistors along the direction of the X axis. Pad layer 73 is formed in each of the respective cell transistors so as to be connected with second plugged conductive layer 69 of the respective cell transistors. Bit line 80 is connected with pad layer 73 through contact hole 79.

Reference numeral 30 represents a P-type semiconductor substrate, reference numeral 32 represents an N-type well, reference numeral 34 represents a P-type pocket well, reference numeral 43 represents a field oxide layer, and reference numeral 44 represents a gate insulating layer.

According to the nonvolatile memory device of the present invention, common source line 71 is formed by an etching process using insulating layer 72 as an etching mask, and pad layer 73 is formed by an etching process using a photosensitive pattern (not shown) as an etching mask. Therefore, since the interval between common source line 71 and pad layer 73 is not limited by a design rule, the memory cell can easily be reduced in size.

Also, first and second plugged conductive layers 66 and 69 are formed on source 400 and drain 300, that is, between the cell transistors. Since this makes the depth of contact hole 79 shallow, in forming contact hole 79 for connecting bit line 80 with drain 300, contact failure can be prevented.

Embodiment 1

The method for manufacturing nonvolatile memory devices according to the first embodiment of the present invention will now be described with reference to FIGS. 2 through 5, FIGS. 8A through 8G and FIGS. 9A through 9G.

Figure 8A:
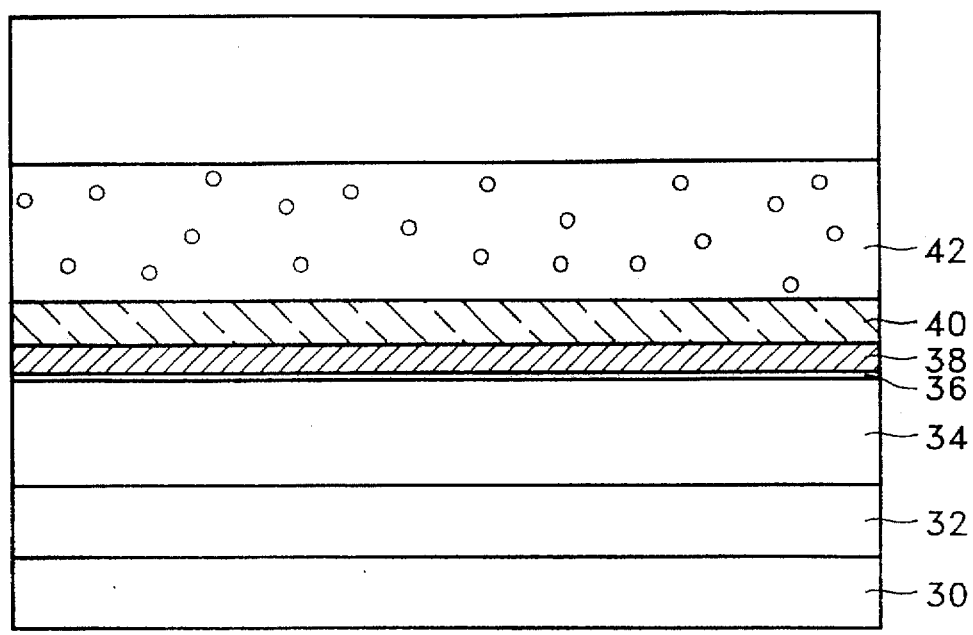
FIGS. 8A through 8G are cross-sectional views taken along for explaining the steps of the method according the first embodiment of the present invention for producing the portion of the nonvolatile memory device shown in FIG. 6.
Figure 9A:
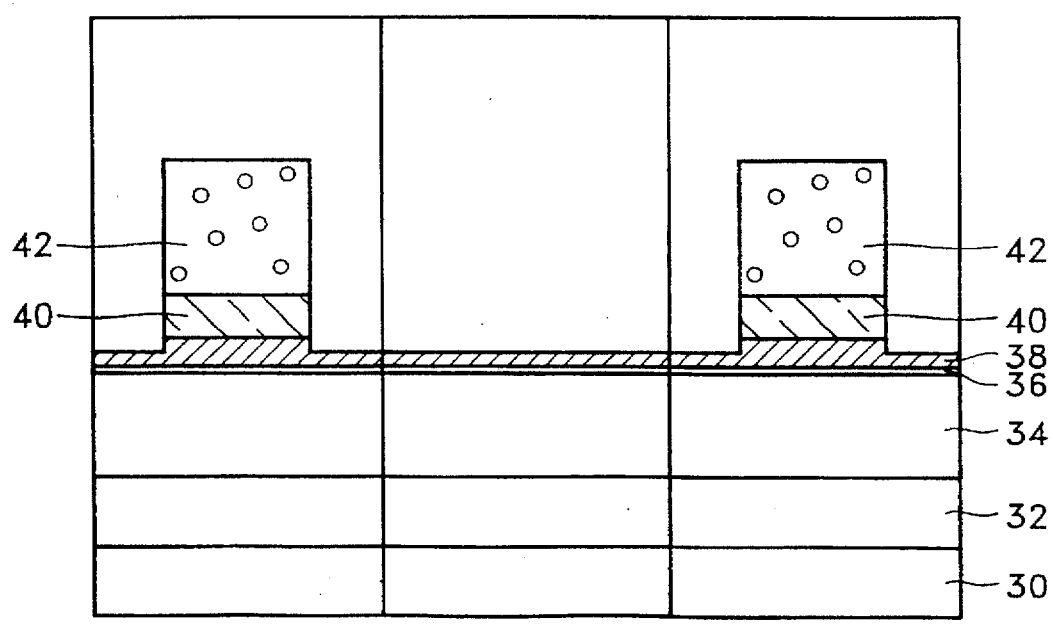
FIGS. 9A through 9G are cross-sectional views taken along, for explaining the steps of the method according the first embodiment of the present invention for producing the portion of the nonvolatile memory device shown in FIG. 7.

First; FIGS. 8A and 9A illustrate the process for forming a field oxide layer (not shown) for defining an active region and an isolation region on substrate 30, which includes the steps of forming well 32 of a second conductivity type in substrate 30 of a first conductivity type (step A-1); forming pocket-well 34 of a first conductivity type within well 32 of the second conductivity (step A-2), depositing pad oxide 36, polysilicon layer 38 and nitride layer 40 on the resultant structure obtained in step A-2 (step A-3), forming first photosensitive pattern 42 covering only the region to be an active region by performing a photolithography process using mask pattern 110, shown in FIG. 2 (step A-4), completely removing nitride layer 40 exposed by using first photoresist 42 as an etching mask (step A-5), and etching polysilicon layer 38, exposed by using first photoresist 42 as an etching mask, to a predetermined depth (step A-6).

The cell array of the nonvolatile memory device according to an embodiment of the present invention is positioned within a triple well composed of P-type pocket well 24, N-type well 32 and P-type semiconductor substrate 30. More specifically, N-type well 32 was formed in P-type semiconductor substrate 30 to a depth of 6 μm~8 μm, and P-type pocket well 34, electrically isolated from P-type semiconductor substrate 30, was formed in N-type well 32 to a depth of 3 μm~4 μm.

The method of forming the triple well is a widely used technology and accordingly the detailed explanation thereof has been omitted here. P-type pocket well 34 to which a high voltage is applied during the erase operation of a memory device, should be electrically isolated from P-type semiconductor substrate 30.

Also, the field oxide layer was formed using a general buffered local-oxide-on-silicon (LOCOS) process.

In the embodiment of the present invention, pad oxide layer 36 is formed to a thickness of about 240 Å, polysilicon layer 38 is formed to a thickness of about 1,000 Å, and nitride layer 40 is formed to a thickness of about 1,500 Å.

After step (A-6), there are further steps of removing first photosensitive pattern 42 (step A-7), forming an N-channel stopper (not shown) by implanting N-type impurities, e.g., boron at a dose of 1.0 E13~1.0 E14 ions/cm² and with energy of 50 keV on the whole surface of the semiconductor substrate from which first photosensitive pattern 42 is removed (step A-8), and forming a field oxide layer (43 in FIG. 9B) to a thickness of about 6,000 Å under an oxidation atmosphere (step A-9).

In FIGS. 8A through 8G, "⊙" represents the front side to the back side of this paper (i.e., direction X) and "→" represents the direction from left to right in the view of this paper (i.e., direction Y), which correspond to the directions shown in FIGS. 2 through 5. That is, the X-axis direction in FIGS. 8A through 8G correspond to that in FIGS. 2 through 5.

Figure 8B:
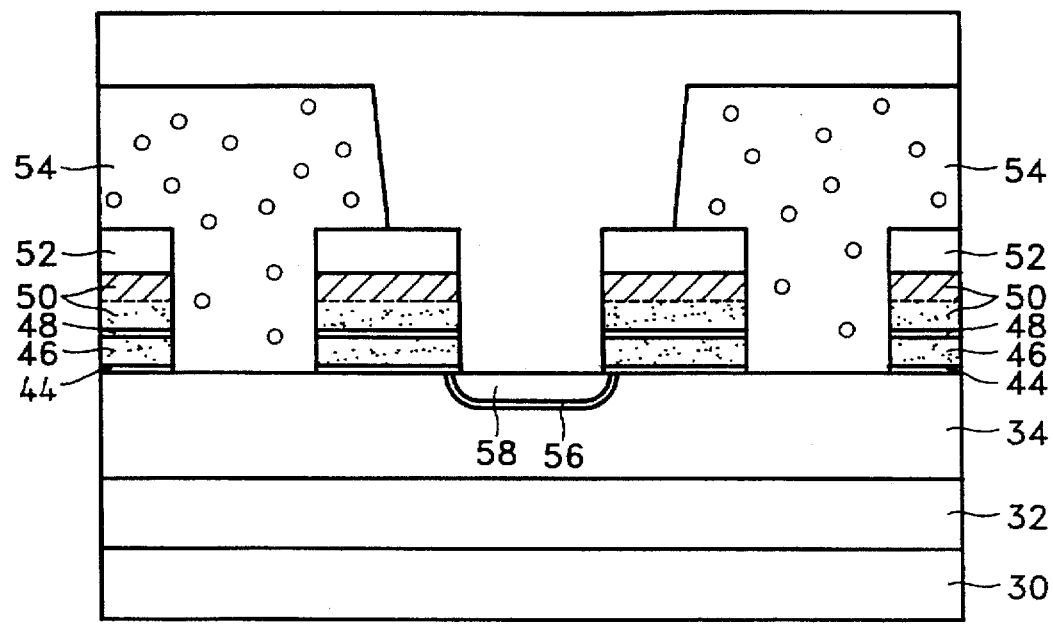
Figure 9B:
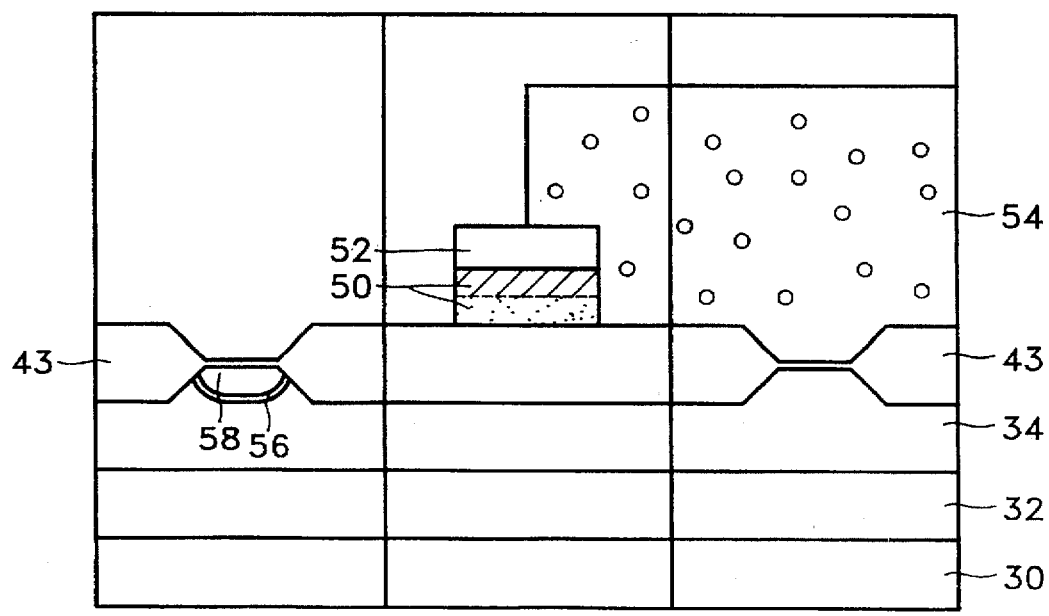

FIGS. 8B and 9B illustrate the process of forming gate insulation layer 44, floating gate 46, dielectric film 48, control gate 50 and drain 300, which includes, after forming field oxide layer 43, the steps of removing materials deposited on semiconductor substrate 30 (step B-1), forming gate insulation layer 44 (step B-2), forming a first conductive layer (to be a floating gate pattern by the follow-up process) on gate insulation layer 44 (step B-3), etching first conductive layer by photolithographic etching using mask pattern 120 of FIG. 2 to form a floating gate pattern (to be floating gate 46 by the follow-up process) (step B-4), forming a dielectric material layer (to be dielectric film 48 by the follow-up process) on the whole surface of the resultant structure obtained in step B-4 (step B-5), sequentially depositing second and third conductive layers (to be control gate 50 by the follow-up process) on the dielectric material layer (step B-6), forming first insulation layer 52 on the third conductive layer (step B-7), etching first insulation layer 52, second and third conductive layers, the dielectric material layer and the floating gate pattern by photolithographic etching using mask pattern 130 of FIG. 2 to form floating gate 46, dielectric film 48 and control gate 50 (step B-8), coating a photoresist layer on the whole surface of the resultant structure obtained by step B-8 (step B-9), forming second photosensitive pattern 54, by a photolithography process using mask pattern 140 of FIG. 2 to expose the semiconductor substrate portion where the drain is to be formed (step B-10), and doping impurities of a first conductivity type in a low concentration to form low concentration impurity layer 56 of the first conductivity type and doping impurities of a second conductivity type in a high concentration to form high concentration impurity layer 58 of the second conductivity type, thereby forming drain 300 (step B-11).

The process of steps B-1 through B-11 can be explained in detail as follows.

The nitride layer used in the LOCOS process is removed by wet etching using phosphoric acid, the polysilicon is dry-etched, and the pad oxide layer is wet-etched (step B-1).

After step B-1, to improve the quality of gate insulation layer 44 formed in the later step, a sacrificial oxide layer should be grown to a thickness of about 500 Å and then removed by wet etching.

Gate insulation layer 44 is formed by growing an oxide layer to a thickness of about 100 Å. The first conductive layer is formed by depositing polysilicone to a thickness of about 1,500 Å. At this time, the polysilicon is doped with phosphorus oxychloride ($POCl_3$) in order to reduce bulk resistance. After deposition of phosphorus oxychloride, the resistance of $POCl_3$-doped polysilicone is about 50 Ω/□.

The floating gate pattern is formed along the Y-axis, i.e., in a long rod shape on the active region, completely covering the active region and partially overlapping with field oxide layer 43.

Dielectric film 48 is formed by sequentially depositing an oxide layer to a thickness of about 100 Å, a nitride layer to a thickness of about 150 Å and an oxide layer to a thickness of about 30~50 Å.

$POCl_3$-doped polysilicon is used as the second conductive layer allowing 50 Ω/□ resistance. As the third conductive layer, silicide, e.g., tungsten silicide ($WSi_2$) is used. The second and third conductive layers are formed to a thickness of about 1,500 Å, respectively. Therefore, control gate 50 has a polycide structure in that polysilicon and tungsten silicide are deposited.

Also, control gate 50 is formed along the X-axis in a long rod shape, that is, shared with adjacent cell transistors disposed along the direction of the X-axis. At this time, floating gate 46 is defined by the respective cell transistors (F in FIG. 2).

Step B-8 (self-align etch process) may be divided into two steps of etching first insulation layer to form a first insulation layer pattern 52 and etching the third and second conductive layers, the dielectric material layer and the floating gate pattern using first insulation layer pattern 52 as the etching mask. At this time, the first insulation layer is preferably formed to a thickness of about 3,000 Å.

The low concentration impurity layer 56 of first conductivity type is formed by implanting P-type impurities, such as boron, at a dose of 1.0 E13~1.0 E14 ions/cm$^2$ with an energy of 50~150 keV. The first high concentration impurity layer 58 of second conductivity type is formed by implanting N-type impurities, such as arsenic, at a dose of 1.0 E15~6.0 E15 ions/cm$^2$ with an energy of 30~80 keV.

After step B-11, heat-processing is performed at about 850°~950° C. to form a drain junction in which low concentration impurity layer 56 of the first conductivity type encompasses first high concentration impurity layer 58 of the second conductivity type. Drain 300 generates many hot electrons in program operation.

Also, during the heat-processing, an oxide layer of about 100~200 Å thickness is grown together so that gate insulation layer 44 is grown slightly more thickly in the overlapping portion of floating gate 46 and drain 300 than in the non-overlapping portion, thereby mitigating the voltage stress generated during cell operation.

Figure 8C:
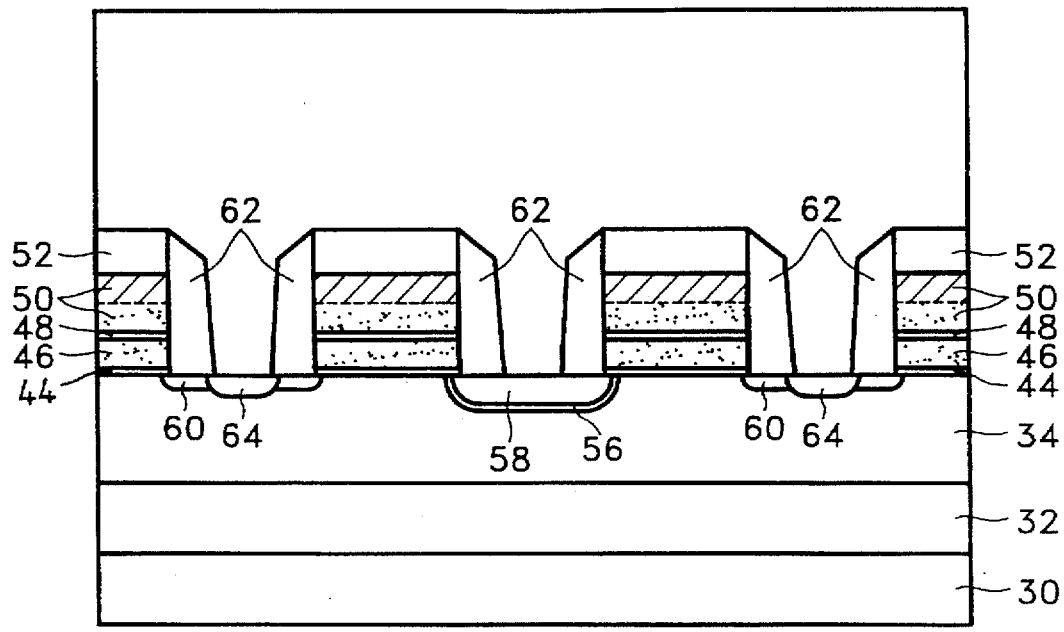
Figure 9C:
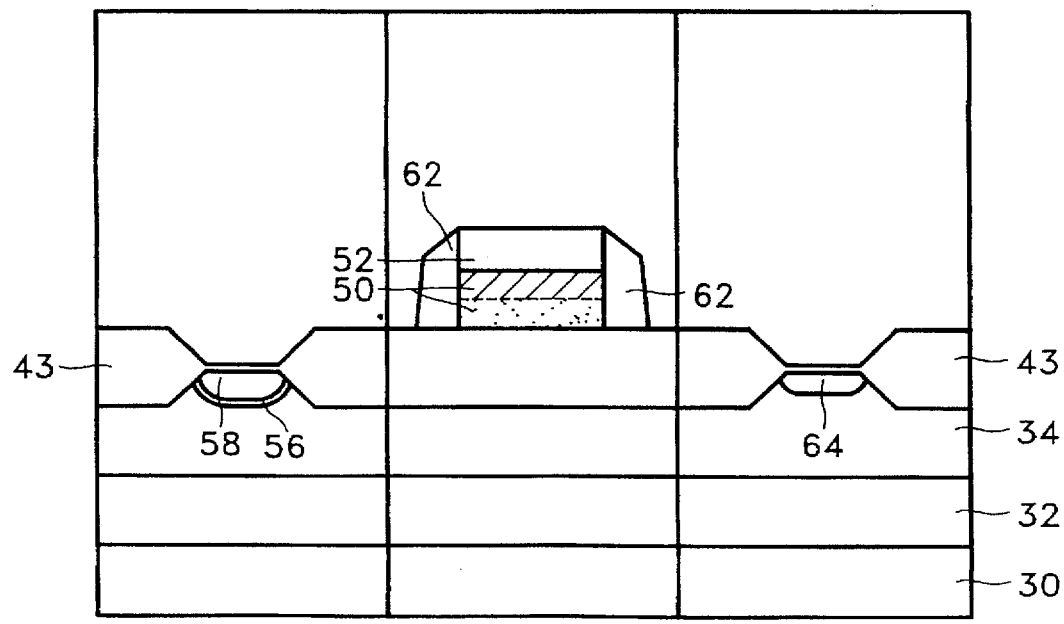

FIGS. 8C and 9C illustrate the process of forming source 400 and spacer 62, which includes the steps of removing second photosensitive pattern 54 (step C-1), doping impurities of a second conductivity type in low concentration to form low concentration impurity layer 60 of the second conductivity type (step C-2), forming second insulation layer (to be spacer 62 by the later process) on the whole surface of the semiconductor substrate having low concentration impurity layer 60 of the second conductivity type formed thereon (step C-3), dry-etching the second insulation layer so as to expose pocket-well 34, thereby forming spacer 62 on the sidewall of gate electrode (46/50) (step C-4), and doping second high concentration impurities of a second conductivity type to form a second high concentration impurity layer 64 of the second conductivity type, thereby forming source 400 (step C-5).

The low concentration impurity layer 60 of the second conductivity type is formed by implanting N-type impurities, e.g., phosphorus (P), at a dose of 1.0 E13~5.0 E13 ions/cm$^2$ with an energy of 30~80 KeV. Second high concentration impurity layer 64 of the second conductivity type is formed by implanting N-type impurities, e.g., arsenic (As), at a dose of about 6.0 E15 ions/cm$^2$ and with energy of 30~100 KeV.

The second insulation layer is formed by depositing an oxide layer to a thickness of about 2,000 Å.

Sources of memory cell transistors have a lightly doped drain (LDD) structure as shown by steps C-2 through C-5.

Figure 8D:
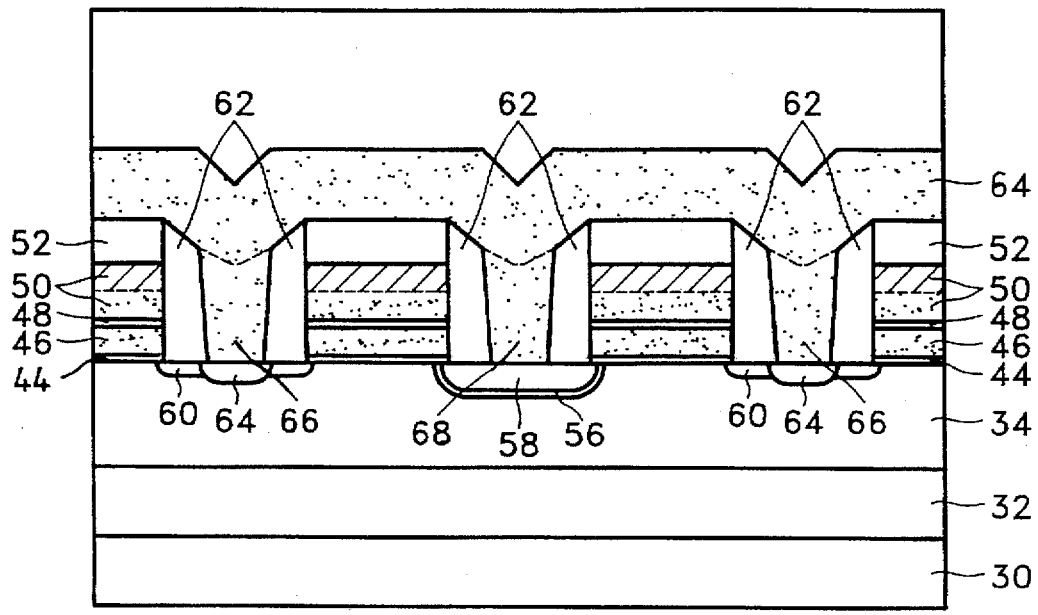
Figure 9D:
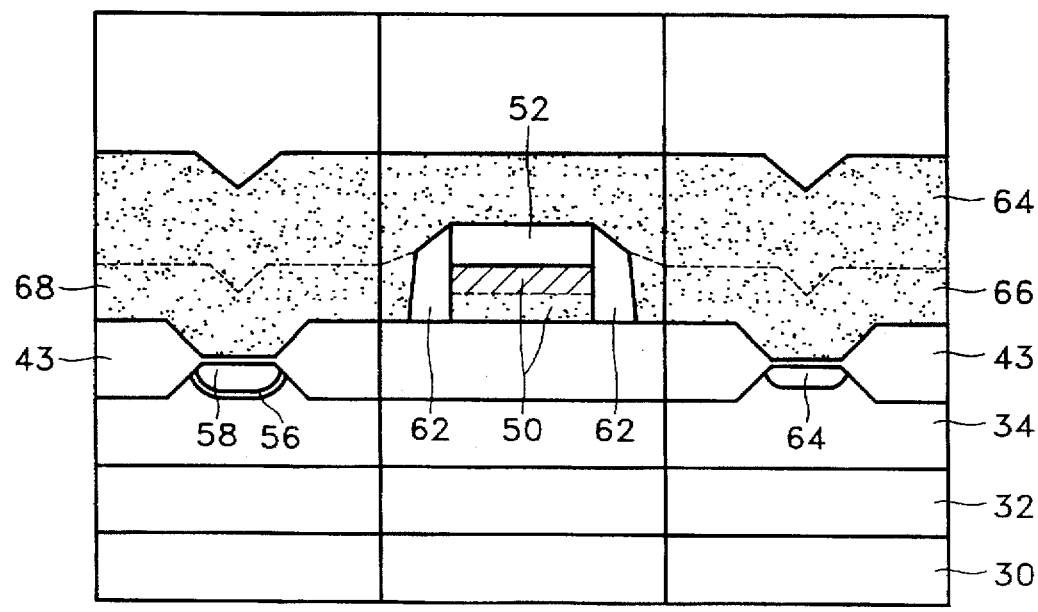

FIGS. 8D and 9D illustrate the process of forming plugged conductive layers 66 and 68, which includes the steps of forming a fourth conductive layer 64 thick enough to completely plug the grooves existing between spacers on the whole surface of the resultant structure having spacer 62 formed therein (step D-1) and etching back fourth conductive layer 64 so as to be barely plugging the grooves, thereby forming plugged conductive layers 66 and 68 (step D-2).

Impurity-doped polysilicon is used as fourth conductive layer 64. At this time, fourth conductive layer 64 must be a half thicker than the gap between spacers.

In forming a contact hole for connecting a bit line (not shown) to drain 300 in a later step, plugged conductive layers 66 and 68 function to prevent contact failure by noticeably reducing the depth of the contact hole.

As shown in FIG. 3, plugged conductive layers 66 and 68 are formed in a long rod shape along the X-axis. In other words, plugged conductive layer 66 formed on source 400 is connected to the sources (not shown) of cell transistors adjacent along the direction of the X-axis. Plugged conductive layer 68 formed on drain 300 is connected to the drains (not shown) of cell transistors adjacent in along the direction of the X-axis (G of FIG. 3).

Figure 8E:
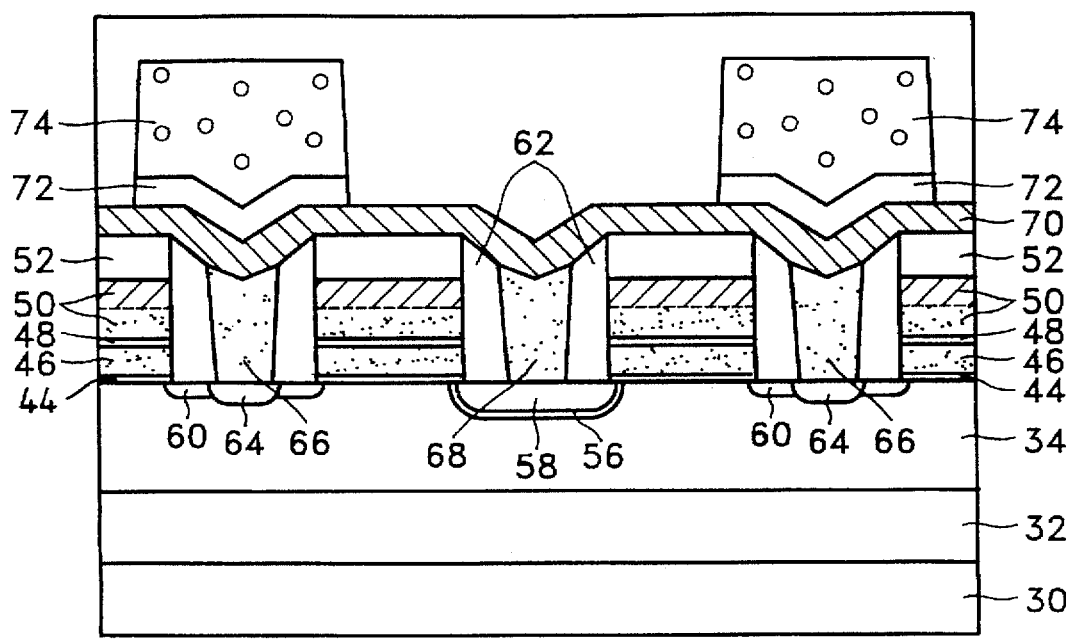
Figure 9E:
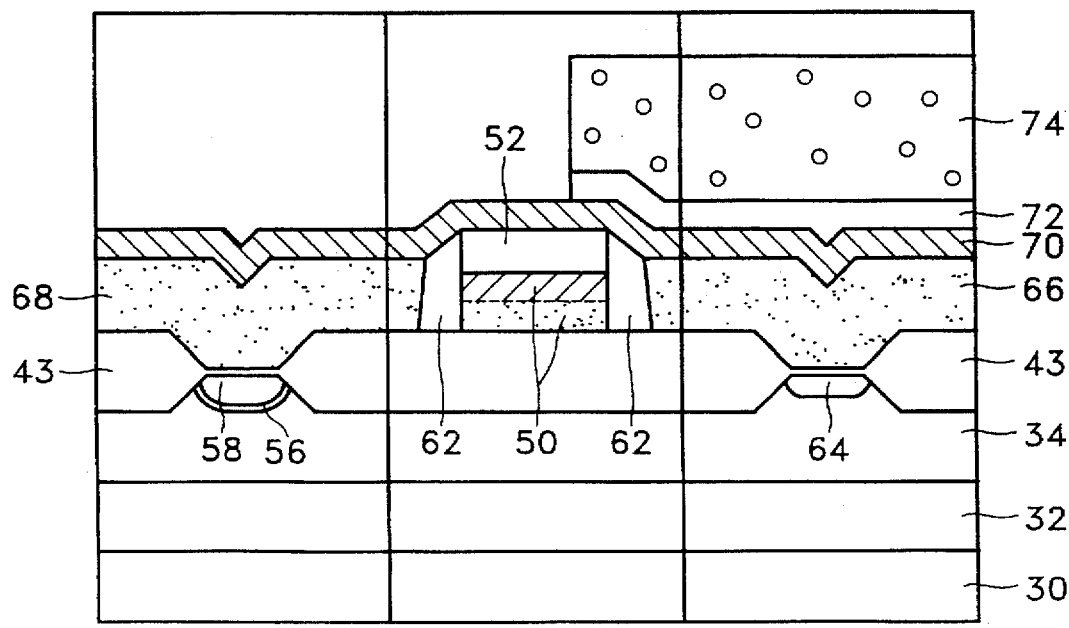

FIGS. 8E and 9E illustrate the process of forming third insulation pattern 72 for forming a common source line (not shown), which includes the steps of forming fifth conductive layer 70 on the whole surface of the semiconductor substrate having plugged conductive layers 66 and 68 formed therein (step E-1), forming a third insulation layer (to be common source line and pad layer 71 and 73 in FIG. 8F, respectively, by a later step) on fifth conductive layer 70 (step E-5), coating a photoresist layer on the third insulation layer (step E-3), forming third photosensitive pattern 74 for forming common source line (step E-4), and performing a dry-etching of the third insulation layer using third photosensitive pattern 74 as the etching mask to form third insulation layer pattern 72 (step E-5).

Silicide is used as fifth conductive layer 70. In the present invention, tungsten silicide (WSi$_2$) is deposited to a thickness of about 1,500 Å to form fifth conductive layer 70.

An oxide layer of about 1,500 Å thickness is used as the third insulation layer. A nitride layer may be used instead of the oxide layer. In other words, any insulation material having a different etching ratio from the material for fifth conductive layer 70 in an arbitrary etching process can be used for the third insulation layer.

Third insulation layer pattern 72 is formed in a long rod shape along the direction of the X-axis, i.e., in parallel with plugged conductive layer 66 formed on source 400.

Figure 8F:
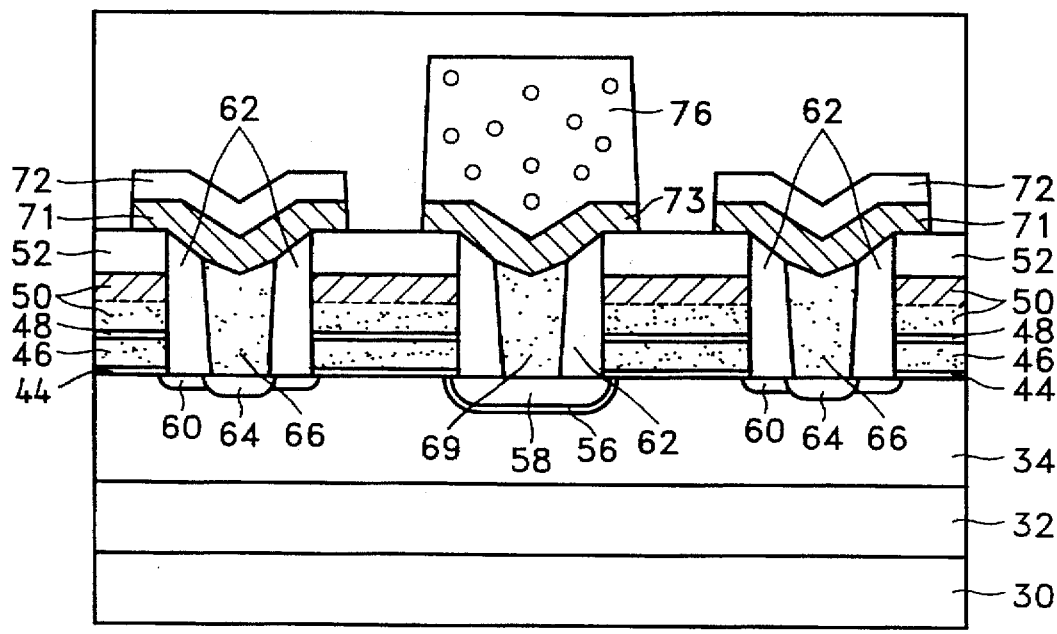
Figure 9F:
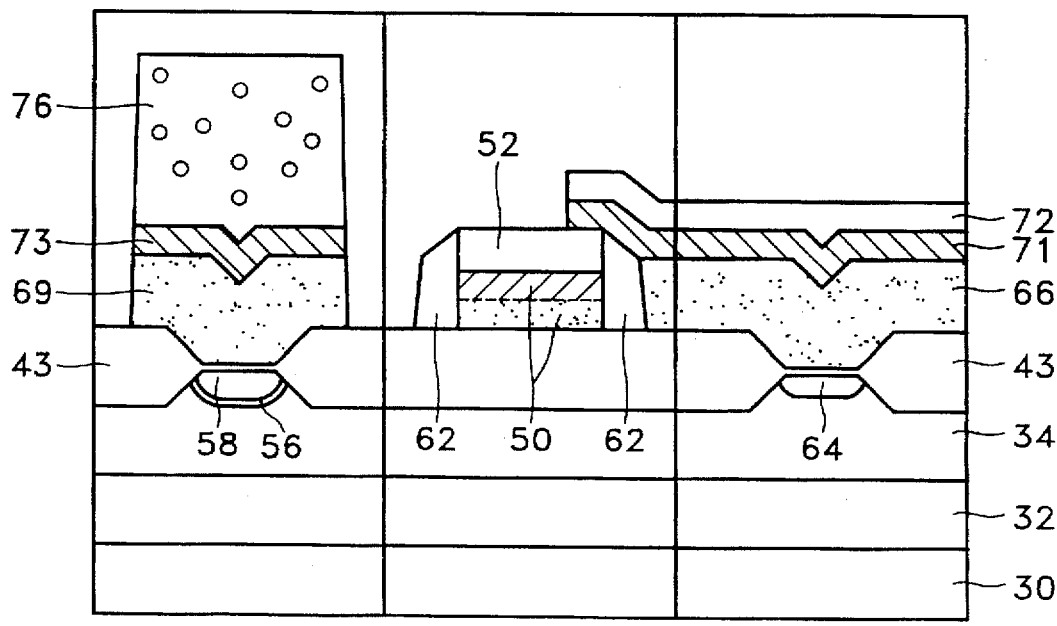

FIGS. 8F and 9F illustrate the process of forming common source line 71 and pad layer 73, which includes the steps of removing third photosensitive pattern (74 in FIG. 8E) (step F-1), redepositing a photoresist layer on the whole surface of the semiconductor substrate from which the third photosensitive pattern is removed (step F-2), performing a photolithography process using mask pattern 160 of FIG. 4 to form a fourth photoresist layer pattern 76 for the formation of pad layer 73 (step F-3), and forming first plugged conductive layer 66, second plugged conductive layer 69, common source line 71 and pad layer 73 by dry-etching fifth conductive layer (70 in FIG. 8E) and plugged conductive layers (66 and 68 in FIG. 8E) using third insulation layer pattern 72 and fourth photosensitive pattern 76 as the etching mask (step F-4).

First plugged conductive layer 66 is form in a long rod shape along the direction of the X-axis, as shown in FIG. 3 (G). Second plugged conductive layer 69 is connected to drains of the respective cell transistors and defined by the respective cell transistors (the length along the direction of the X-axis thereof being the same as that of mask pattern 160 of FIG. 4).

Common source line 71 is disposed in parallel with first plugged conductive layer 66 covering the same completely, and is connected to source 400 via first plugged conductive layer 66.

Pad layer 73 is disposed in parallel with second plugged conductive layer 69 to cover the same completely, and is connected to drain 300 via first plugged conductive layer 66.

As shown in FIG. 4, common source line 71 and first plugged conductive layer 66 are shared by sources of cell transistors adjacent along the direction of the X-axis. However, pad layer 73 and second plugged conductive layer 69 are confined by the respective cell transistors.

As shown in FIGS. 8E, 9E, 8F and 9F, common source line 71 and pad layer 73 are formed by different photolithographic etching processes, respectively. In other words, common source line 71 is formed by the etching process using third insulation pattern 72 as the etching mask, but pad layer 73 is formed by the etching process using fourth photosensitive pattern 76 as the etching mask. At this time, third insulation pattern 72 and fourth photosensitive pattern 76 are formed by two different photolithography processes.

Therefore, the interval between common source line 71 and pad layer 73, formed in the above-described processes, is not limited by a design rule. In other words, the interval between common source line 71 and pad layer 73 is reduced to a misalign limit.

Figure 8G:
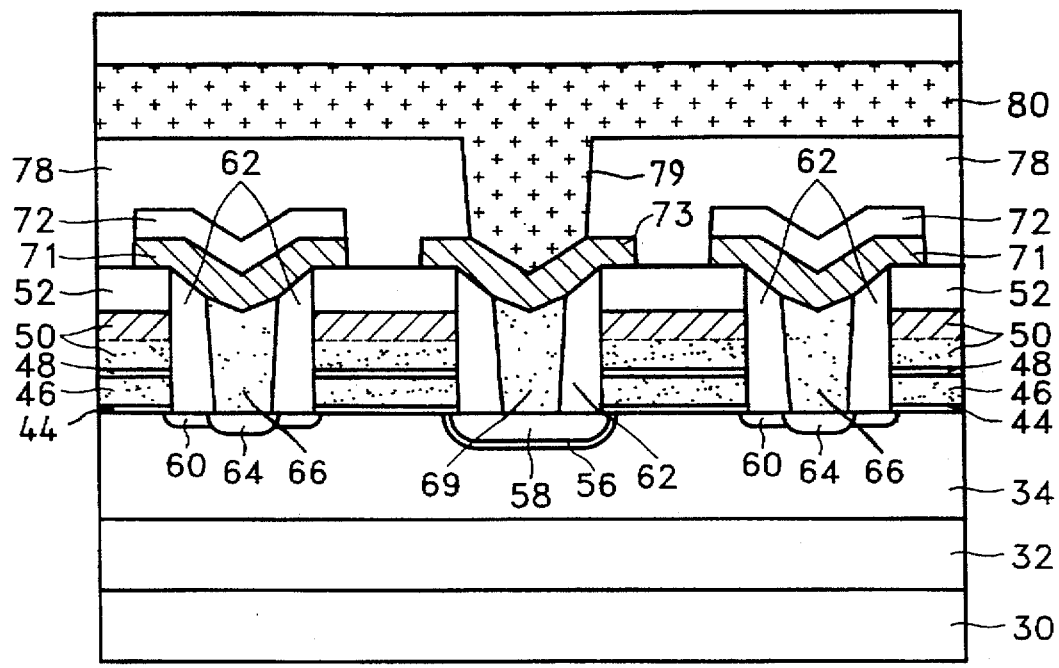
Figure 9G:
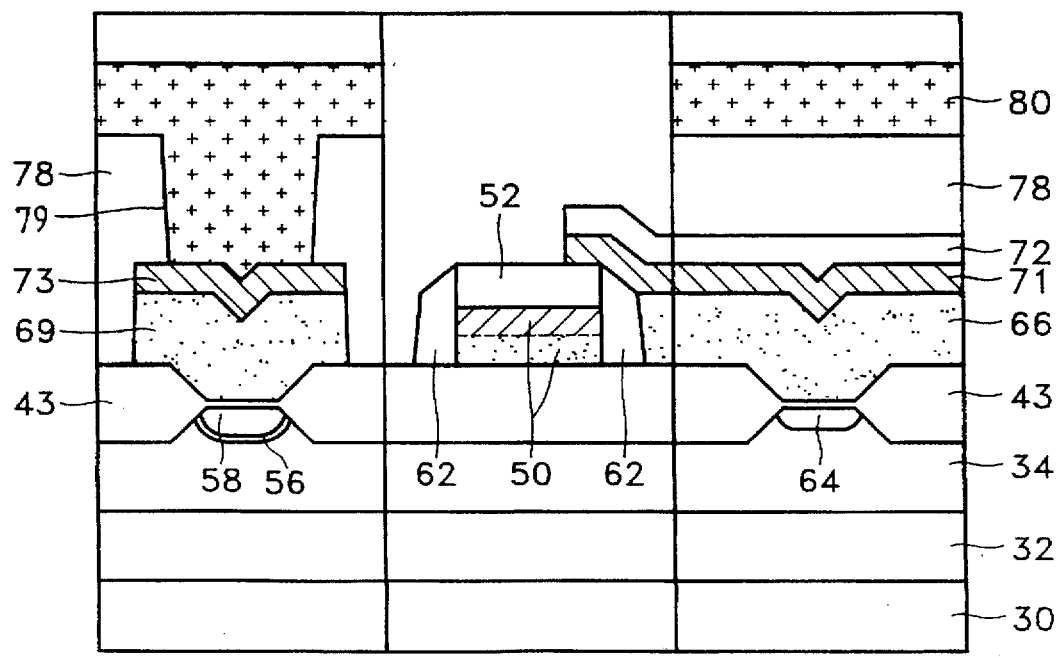

FIGS. 8G and 9G illustrate the process of forming bit line 80, which includes the steps of forming interlayer insulating film 78 on the whole surface of the semiconductor substrate having common source line 71 and pad layer 73 formed therein by depositing, for instance, an oxide layer and borophosphosilicate glass (BPSG) (step G-1), forming contact hole 79, exposing pad layer 78 by partially etching interlayer insulating film 78 by the photolithographic etching process using mask pattern 170 of FIG. 5 (step G-2), and forming bit line 80 by depositing a sixth conductive layer (to be bit line 80 by a later step) to fill contact hole 79 and then patterning the sixth conductive layer by the photolithographic etching process using mask pattern 180 of FIG. 5 (step G-3).

In order to improve step coverage, the borophosphosilicate glass is reflown by heat-processing at 950° C. for about 30 minutes under a nitrogen atmosphere.

Aluminum, for instance, is used for the sixth conductive layer.

Bit line 80 is formed along a long rod shape in the direction of the Y-axis and is shared by cell transistor's drains (not shown) adjacent along the direction of the Y-axis.

Embodiment 2

In the first embodiment, in order to form common source line 71 and pad layer 73, the third insulation pattern (72 in FIG. 8E) for common source line formation is first formed on the fifth conductive layer (70 in FIG. 8E) and the fourth photosensitive pattern (76 in FIG. 8F) for pad layer formation is then formed.

Figure 10A:
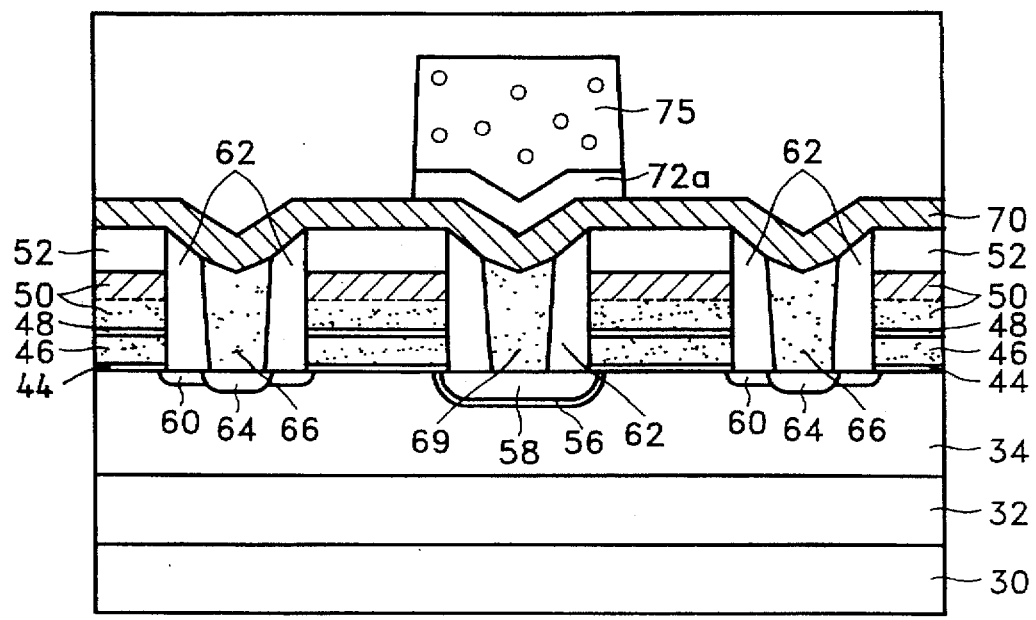
FIGS. 10A through 10C are cross-sectional views taken, for explaining the steps of the method for producing a portion of a nonvolatile memory according the second embodiment of the present invention.
Figure 11A:
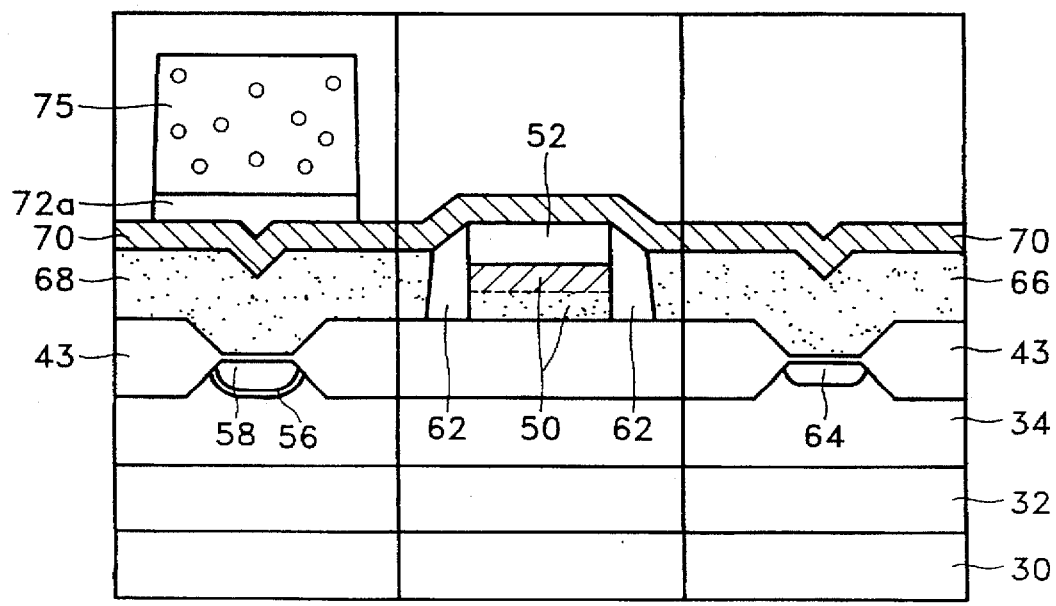
FIGS. 11A through 11C are cross-sectional views taken, for explaining the steps of the method for producing a further portion of a nonvolatile memory according the second embodiment of the present invention.
Figure 10B:
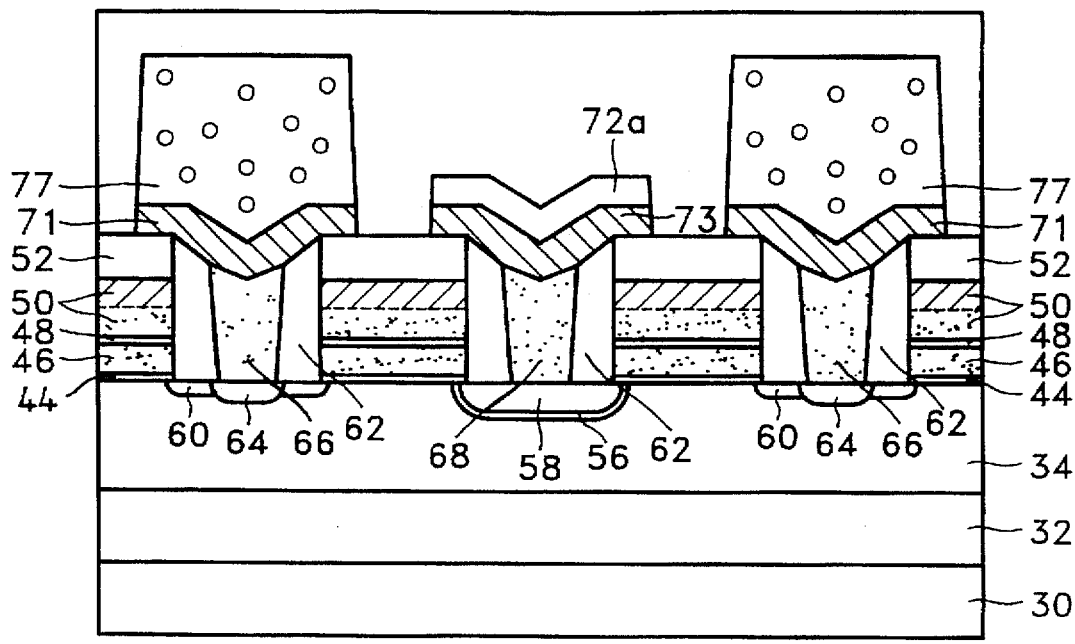
Figure 11B:
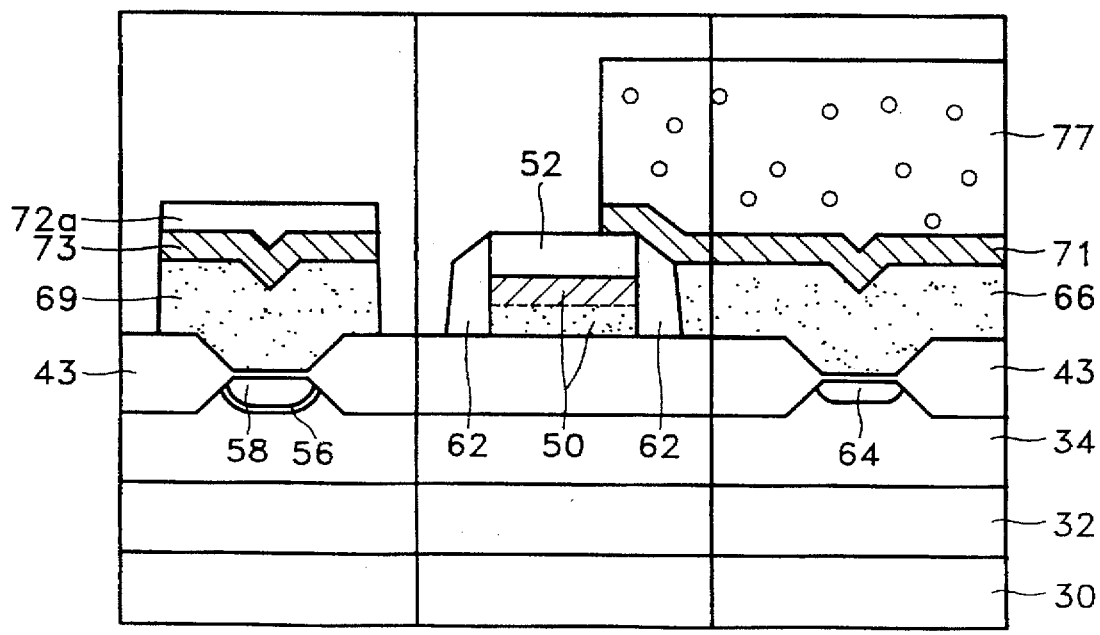

However, in this embodiment, an insulation pattern 72a for pad layer formation is first formed on the fifth conductive layer (FIGS. 10A and 11A) and photosensitive pattern 77 for common source line formation is then formed (FIGS. 10B and 11B).

Figure 10C:
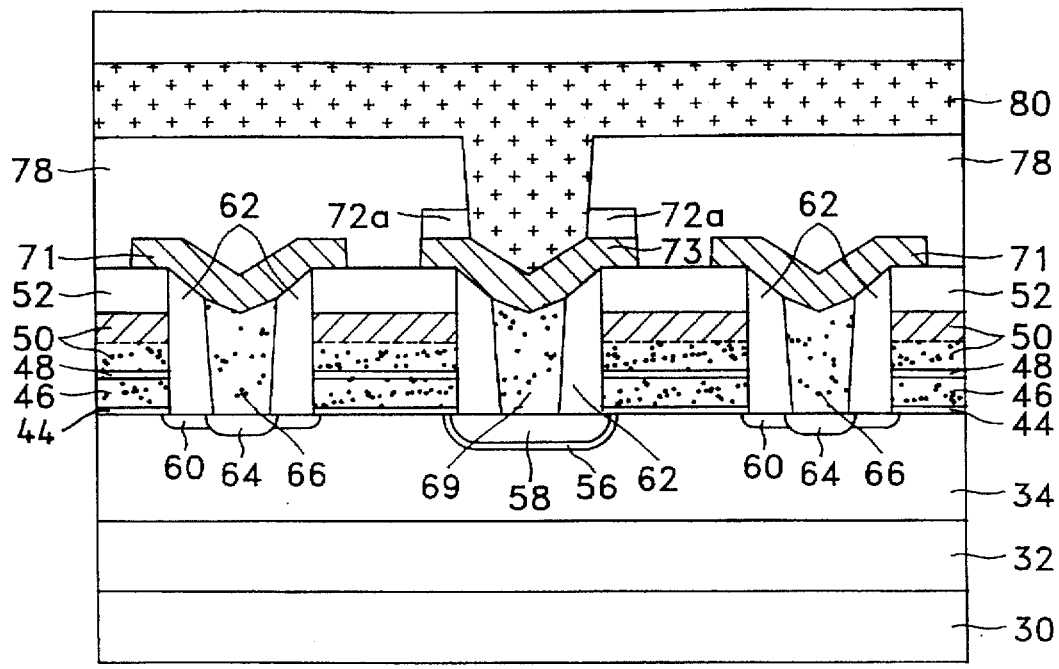
Figure 11C:
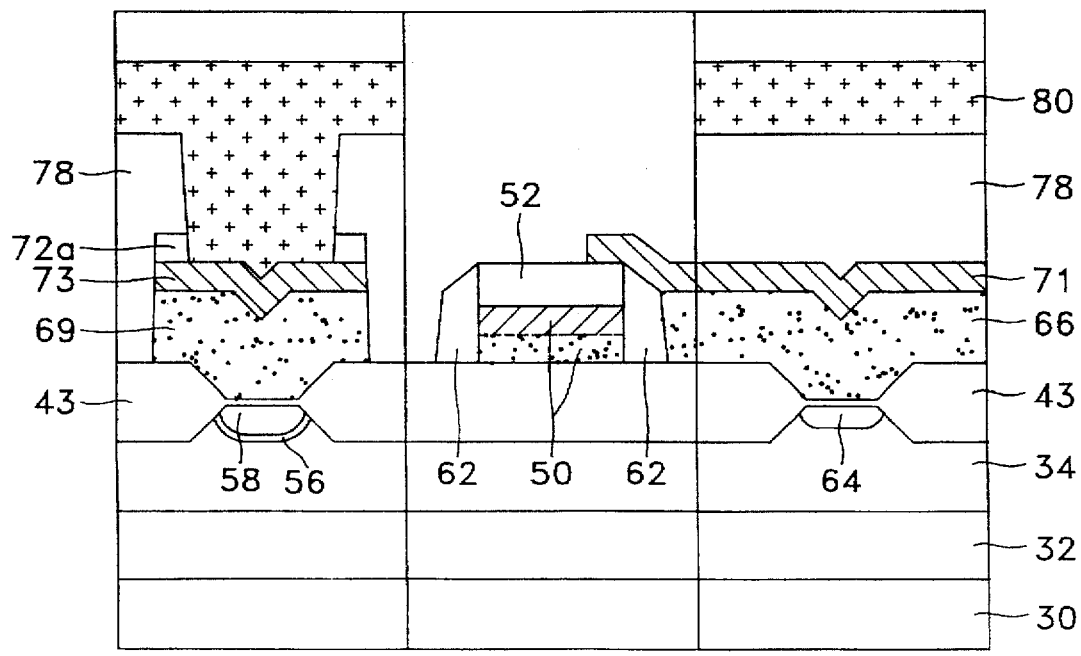
Figure 12:
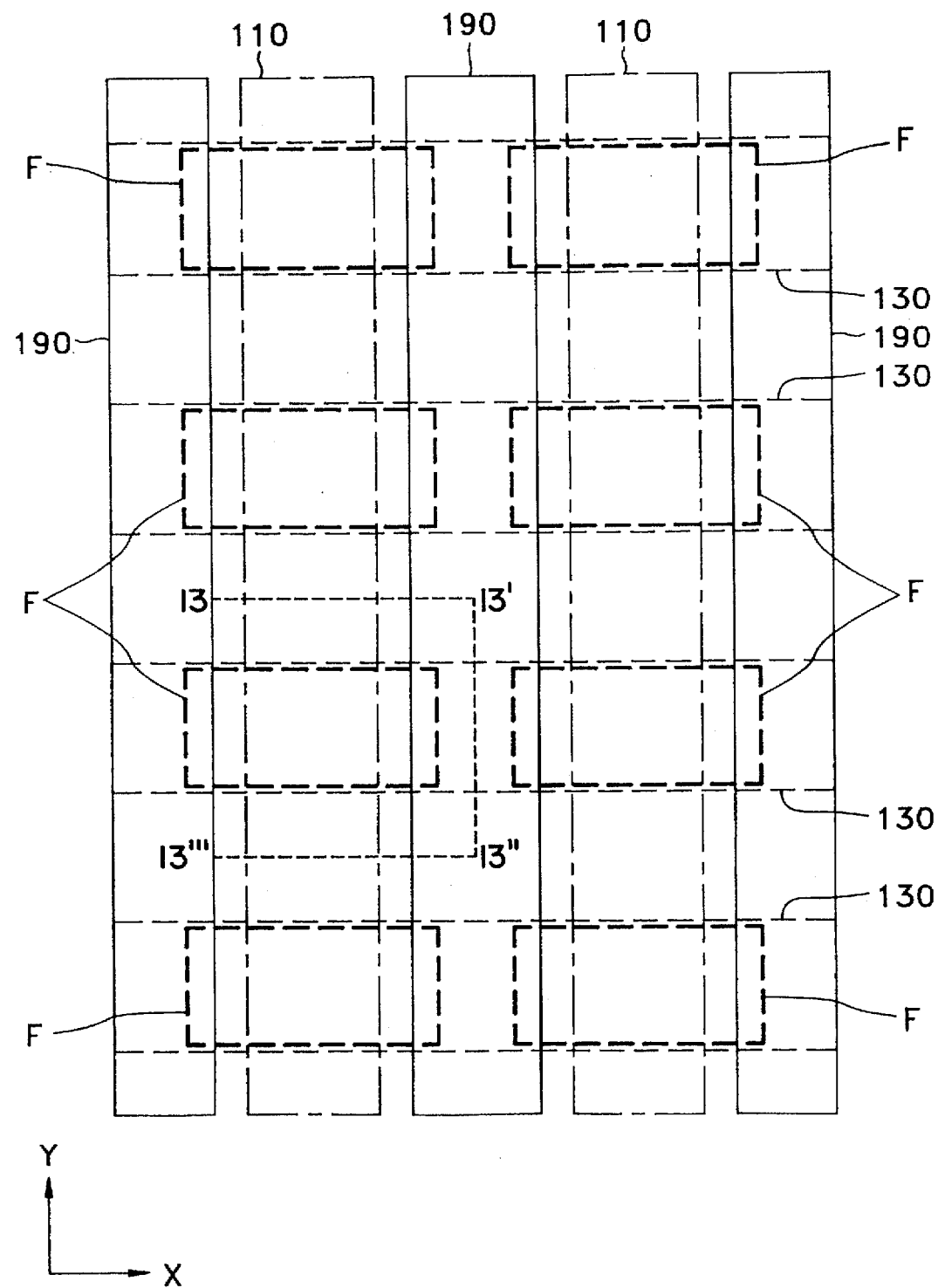
FIG. 12 is a layout diagram used in manufacturing a nonvolatile memory device according to a third embodiment of the present invention.

According to the first embodiment, third insulation pattern 72 is formed on common source line 71 (FIG. 8G). However, according to this embodiment, third insulation pattern 72a is formed on pad layer 73 (FIGS. 10C and 11C).

Embodiment 3

This embodiment illustrates a spacer formed on the side walls of the gate electrode of the nonvolatile memory cell. In the first embodiment, a separate mask pattern for forming a spacer is not required (FIGS. 8C and 9C). However, in this embodiment, a separate mask pattern 190 for forming a spacer is used.

Figure 13:
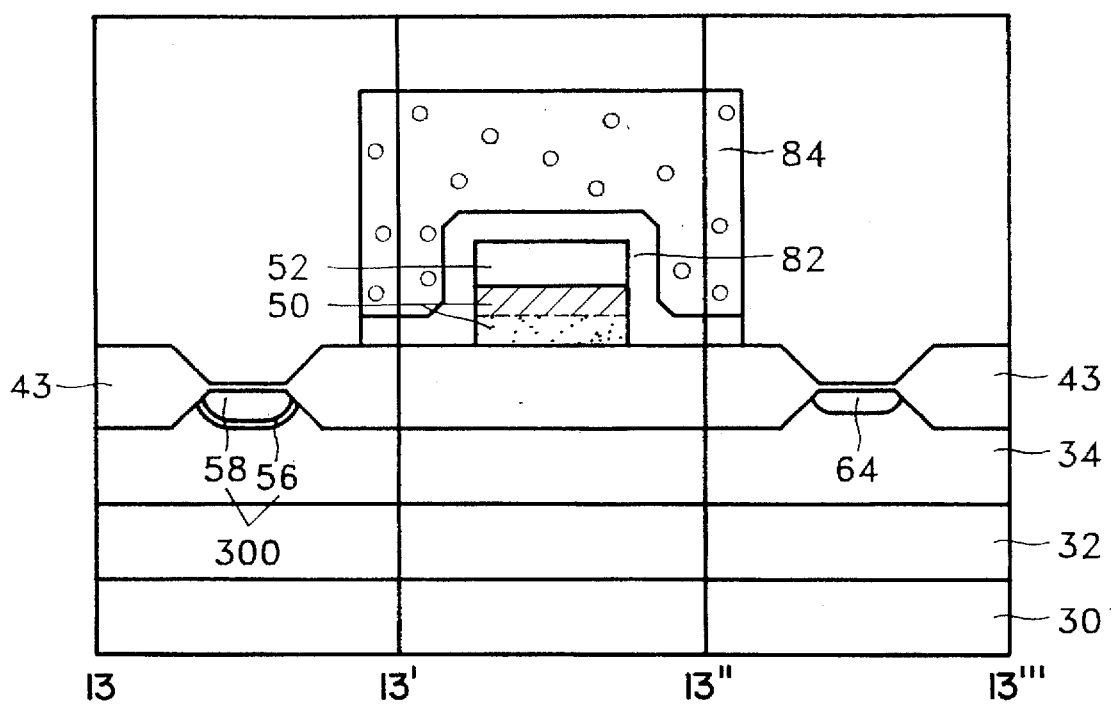
FIG. 13 is a cross-sectional view taken along the line 13–13'–13"–13'" shown in FIG. 12, for explaining the method for producing a portion of a nonvolatile memory according the third embodiment of the present invention.
Figure 14:
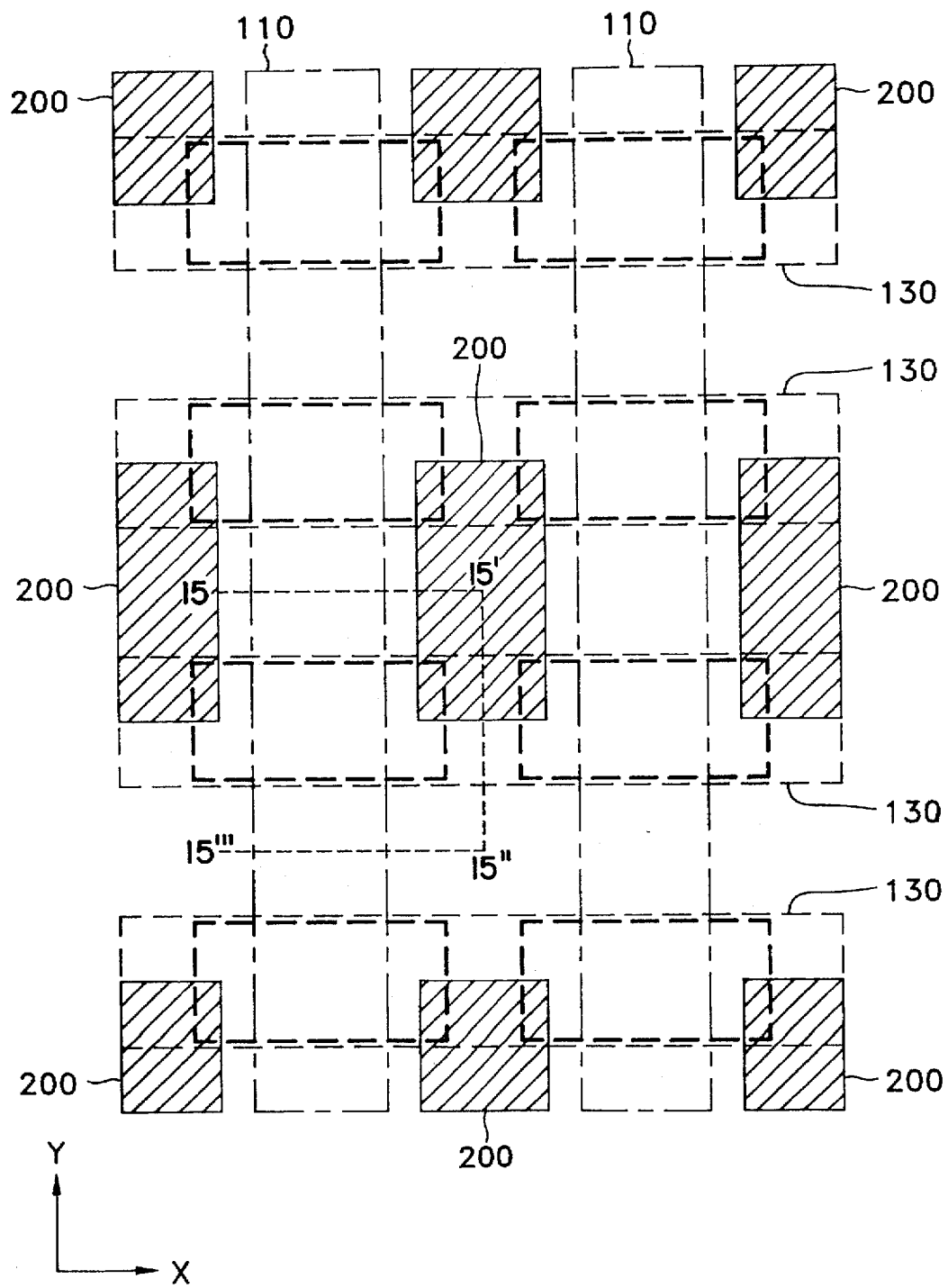
FIG. 14 is a layout diagram used in manufacturing a nonvolatile memory device according to a fourth embodiment of the present invention.
Figure 15:
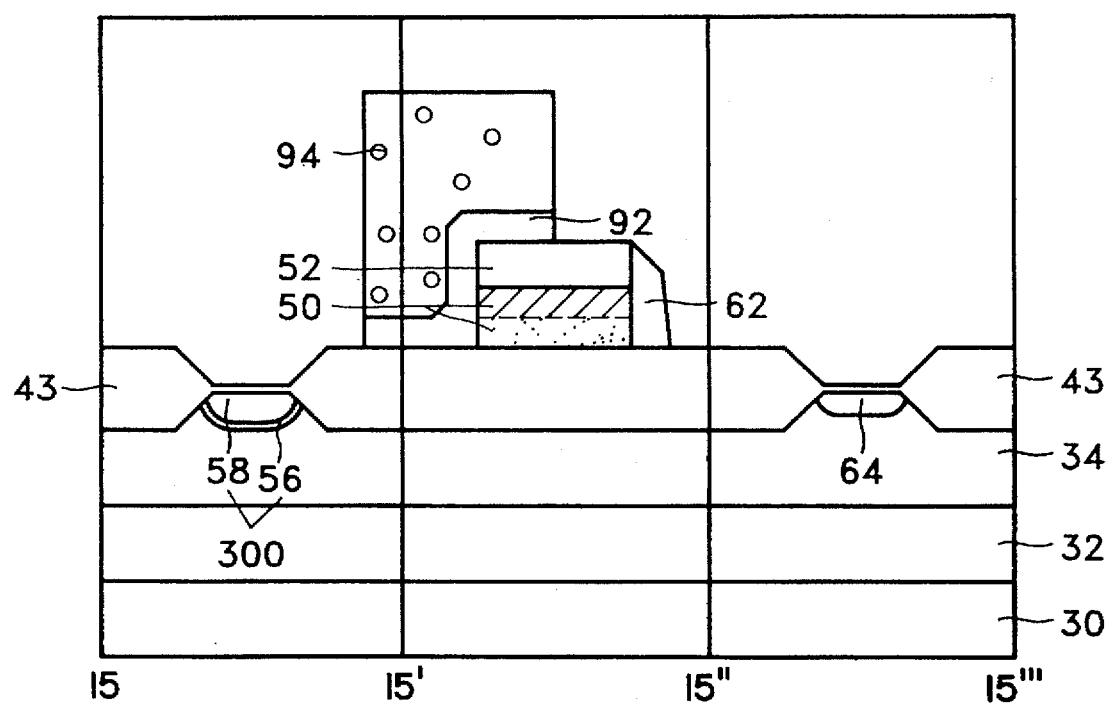
FIG. 15 is a cross-sectional view taken along the line 15–15'–15"–15'" shown in FIG. 14, for explaining the steps of the method for producing a portion of a nonvolatile memory according the fourth embodiment of the present invention.

In this embodiment, during the etching process for the formation of spacer 82, etching mask 84, formed of a photoresist layer, is formed on a field oxide layer. Thus, spacer 62 shown in FIG. 8C is formed in the active region portion and insulation layer pattern 82 shown in FIG. 13 is formed in the field oxide layer portion.

This embodiment is proposed for improving the step difference. The step difference of the field oxide layer portion is reduced by insulation pattern 82 during subsequent processes.

Embodiment 4

This embodiment is for attaining the same effect as that of the third embodiment. A mask pattern 200 covering the field oxide layer between drains of memory cell transistors is used.

According to this embodiment, using photosensitive pattern 94 covering the field oxide layer between drains, an etching process is performed so that insulation pattern 92 remains on field oxide layer 43 and spacer 62 is formed only on the sidewall of the gate electrode of the nonvolatile memory cell not covered by photosensitive pattern 92 on field oxide layer 43.

Therefore, in the nonvolatile memory device and manufacturing method thereof according to the present invention, since common source line and pad layer are formed by different photolithographic etching processes, there is no limit in reducing the interval between them, which facilitates greater integration. Next, as plugged conductive layers fill grooves formed on sources/drains between gate electrodes of the respective cells and then a contact hole for connecting a bit line to drains is formed, the depth of the contact hole is reduced, thereby preventing contact failures. In addition, since the process of burying tungsten into the contact hole is not necessary, problems resulting from this process are not generated.

It is apparent that the present invention is not limited to the foregoing examples but numerous changes thereof may be made by those skilled in the art within the spirit of the invention.

What is claimed is:

1. A nonvolatile memory device manufacturing method comprising the steps of:

forming cell transistors having sources and drains shared by cell transistors adjacent to one another in a first direction, a floating gate confined to each cell transistor, and a control gate shared by cell transistors adjacent in a second direction;

forming a first conductive layer so as to fill grooves between said cell transistors, on the resultant structure after said cell transistors forming step;

plugging only said grooves with said first conductive layer by etching back said layer;

forming a second conductive layer on the resultant structure after said plugging step;

forming a first insulating layer on said second conductive layer;

forming a first insulating layer pattern in a rod shape lengthwise in a second direction by patterning said insulating layer so as to contain said sources of cell transistors adjacent in said second direction;

forming a first photosensitive pattern in a shape on said drains of alternating said cell transistors in said first direction; and forming a first plugged conductive layer formed of said first conductive layer for connecting said sources of said cell transistors adjacent in said second direction, a common source line formed of said second conductive layer, being in parallel with said first plugged conductive layer, a second plugged conductive layer formed of said first conductive layer for connecting said drains of said cell transistors, and a pad layer formed of said second conductive layer for being connected with said second plugged conductive layer, by etching said first and second conductive layers using said first insulating layer pattern and first photosensitive pattern as an etching mask.

2. A nonvolatile memory device manufacturing method as claimed in claim 1, further comprising the steps of:

forming an interlayer insulating film, forming a contact hole in said interlayer insulating film to expose said pad layer and forming a bit line for connecting said pad layer through said contact hole.

3. A nonvolatile memory device manufacturing method as claimed in claim 1, wherein impurity-doped polysilicon is used as said first conductive layer and silicide material is used as said second conductive layer.

4. A nonvolatile memory device manufacturing method as claimed in claim 3, wherein tungsten silicide is used as said silicide material.

5. A nonvolatile memory device manufacturing method as claimed in claim 1, wherein said cell transistor forming step includes the substeps of:

forming a field oxide layer for dividing a semiconductor substrate into an active region and a field region;

forming a gate insulating layer on said active region of said semiconductor substrate;

forming a third conductive layer on the resultant structure after forming said gate insulating layer;

forming a floating gate pattern of a rod shape lengthwise in said first direction by patterning said third conductive layer;

sequentially depositing a dielectric film, a fourth conductive layer and a fifth conductive layer over the entire surface of the resultant structure after forming said floating gate pattern;

forming a floating gate confined to said respective cell transistors and a control gate shared by cell transistors which are adjacent in said second direction by patterning said floating gate pattern, dielectric film, fourth conductive layer and fifth conductive layer in a rod shape lengthwise in said second direction;

forming a second photosensitive layer pattern exposing a region of said semiconductor substrate where drains are to be formed;

forming drains having a first high-concentration impurity layer of a second conductivity type and a low-concentration impurity layer of a first conductivity type surrounding said first high-concentration impurity layer of said second conductivity type, said drains shared by cell transistors which are adjacent in said first direction by implanting low-concentration impurities of said first conductivity type and then implanting first high-concentration impurities of said second conductivity type;

removing said second photosensitive pattern;

implanting low-concentration impurities of said second conductivity type over the semiconductor substrate from which said second photosensitive pattern has been removed; forming spacers on the side wall of the gate electrodes of said respective cell transistors by forming a second insulating layer over the resultant structure after implanting low-concentration impurities and then anisotropically etching the second insulating layer; and forming sources having a second high-concentration impurity layer of said second conductivity type and a low-concentration impurity layer of said second conductivity type, partially overlapped with said second high-concentration impurity layer of said second conductivity type by implanting second high-concentration impurities of said second conductivity type over the semiconductor substrate having said spacers, said sources being shared by cell transistors which are adjacent in said first direction.

6. A nonvolatile memory device manufacturing method as claimed in claim 5, wherein impurity-doped polysilicon is used as said third and fourth conductive layers and tungsten silicide is used as said fifth conductive layer.

7. A nonvolatile memory device manufacturing method as claimed in claim 5, wherein the impurities of said first conductivity type is P-impurities and the impurities of said second conductivity type is N-impurities.

8. A nonvolatile memory device manufacturing method as claimed in claim 7, wherein, in said drains forming step, the step of implanting low concentration impurities of said first conductivity type is performed in the manner that boron ions are implanted at a dose of 1.0 E13 to 1.0 E14 ions/cm$^2$ with an energy of about 50 to 150 KeV, and the step of implanting first high concentration impurities of said second conductivity type is performed in the manner that arsenic ions are implanted at a dose of 1.0 E15 to 6.0 E15 ions/cm$^2$ with an energy of about 30 to 80 KeV.

9. A nonvolatile memory device manufacturing method as claimed in claim 7, wherein, in said sources forming step, the step of implanting low concentration impurities of said second conductivity type is performed in the manner that phosphorus ions are implanted at a dose of 1.0 E13 to 5.0 E13 ions/cm$^2$ with an energy of about 30 to 80 KeV, and the step of implanting second high concentration impurities of said second conductivity type is performed such that arsenic ions are implanted at a dose of 6.0 E15 ions/cm$^2$ with an energy of about 30 to 100 KeV.

10. A nonvolatile memory device manufacturing method as claimed in claim 5, wherein said step of patterning said floating gate pattern, dielectric film, fourth and fifth conductive layers is processed by the substeps of:

forming a third insulating layer on said fifth conductive layer;

forming a third photosensitive pattern for forming a control gate in a rod shape lengthwise in said second direction by depositing a photoresist on said third insulating layer and performing a photolithography process with respect thereto;

forming a third insulating layer pattern for forming a control gate by anisotropically etching said third insulating layer using said third photosensitive pattern as an etching mask; and anisotropically etching said fifth conductive layer, fourth conductive layer, dielectric film and floating gate pattern using said third insulating pattern as an etching mask.

11. A nonvolatile memory device manufacturing method comprising the steps of:

forming cell transistors having sources and drains shared by cell transistors adjacent in a first direction, a floating gate confined to each cell transistor, and a control gate shared by cell transistors adjacent in a second direction;

forming a first conductive layer to fill grooves between said cell transistors on the resultant structure obtained after said cell transistor forming step;

plugging only said grooves with said first conductive layer by etching back said first conductive layer;

forming a second conductive layer on the resultant structure after said plugging step;

forming a first insulation layer on said second conductive layer;

forming a first insulation layer pattern on said drains of said cell transistors to be confined to said cell transistors by etching said first insulation layer;

coating a photoresist on the resultant structure after forming said first insulation layer;

forming a first photosensitive pattern in a rod shape in a second direction to include sources which are adjacent in said second direction; and forming a first plugged conductive layer formed of said first conductive layer for connecting said sources of said cell transistors adjacent in said second direction, a common source line formed of said second conductive layer, being in parallel with said first plugged conductive layer, a second plugged conductive layer formed of said first conductive layer for connecting said drains of said cell transistors, and a pad layer formed of said second conductive layer for being connected with said second plugged conductive layer, by etching said first and second conductive layers using said first insulation layer pattern and first photosensitive pattern as an etching mask.

\* \* \* \* \*